United States Patent
Chang et al.

(10) Patent No.: US 9,627,375 B2
(45) Date of Patent: Apr. 18, 2017

(54) INDENTED GATE END OF NON-PLANAR TRANSISTOR

(71) Applicant: TAIWAN SEMICONDUCTOR MANUFACTURING COMPANY LTD., Hsinchu (TW)

(72) Inventors: Che-Cheng Chang, New Taipei (TW); Chang-Yin Chen, Taipei (TW); Jr-Jung Lin, Hsinchu (TW); Chih-Han Lin, Hsinchu (TW); Yi-Jen Chen, Hsinchu (TW); Yung Jung Chang, Hsinchu County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 14/175,425

(22) Filed: Feb. 7, 2014

(65) Prior Publication Data
US 2015/0228647 A1   Aug. 13, 2015

(51) Int. Cl.
| | | |
|---|---|---|
| *H01L 27/088* | (2006.01) | |
| *H01L 21/8234* | (2006.01) | |
| *H01L 21/3213* | (2006.01) | |
| *H01L 21/311* | (2006.01) | |

(52) U.S. Cl.
CPC .. *H01L 27/0886* (2013.01); *H01L 21/823431* (2013.01); *H01L 21/823437* (2013.01); *H01L 21/31116* (2013.01); *H01L 21/31144* (2013.01); *H01L 21/32137* (2013.01); *H01L 21/32139* (2013.01)

(58) Field of Classification Search
CPC ............. H01L 29/66795; H01L 21/845; H01L 21/823431; H01L 29/7855; H01L 29/41791; H01L 27/1211; H01L 29/7853; H01L 29/78696; H01L 29/775; H01L 29/0673; H01L 29/045; H01L 29/66439; H01L 29/66772
See application file for complete search history.

(56) References Cited

U.S. PATENT DOCUMENTS

| | | | |
|---|---|---|---|
| 2006/0071275 A1* | 4/2006 | Brask et al. ................ | 257/350 |
| 2006/0086977 A1* | 4/2006 | Shah et al. ................. | 257/347 |
| 2010/0276761 A1* | 11/2010 | Tung et al. ................. | 257/384 |
| 2012/0199888 A1* | 8/2012 | Dai ....................... | H01L 29/045 |
| | | | 257/288 |

(Continued)

*Primary Examiner* — Joshua King
*Assistant Examiner* — Mohammed R Alam
(74) *Attorney, Agent, or Firm* — Anthony King; Kay Yang

(57) ABSTRACT

In some embodiments, a semiconductor structure includes a substrate, a dielectric region, a non-planar structure and a gate stack. The dielectric region is formed on the substrate, and has a top surface. The non-planar structure protrudes from the top surface, and includes a channel region, and source and drain regions formed on opposite sides of the channel region. The gate stack is formed on the top surface, wraps around the channel region, and includes a gate top surface, and a gate side wall that does not intersect the non-planar structure. The gate side wall has a first distance from a vertical plane at a level of the top surface, and a second distance from the vertical plane at a level of the gate top surface. The vertical plane is vertical with respect to the top surface, and intersects the non-planar structure. The first distance is shorter than the second distance.

20 Claims, 15 Drawing Sheets

(56) References Cited

U.S. PATENT DOCUMENTS

2013/0168748 A1\* 7/2013 Bao .................. H01L 21/82380
                                                                                       257/288
2014/0151705 A1\* 6/2014 Xiao et al. ...................... 257/64

\* cited by examiner

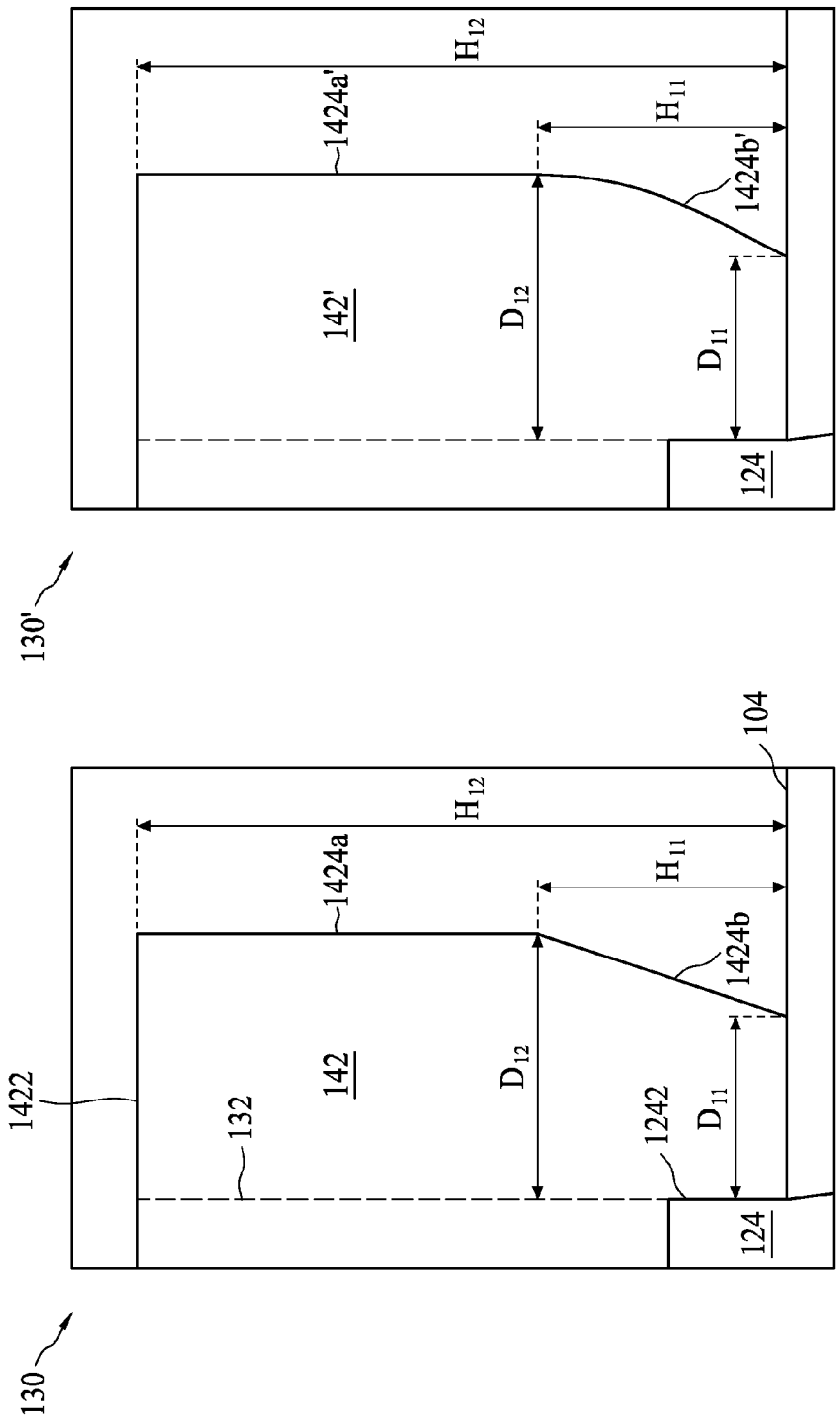

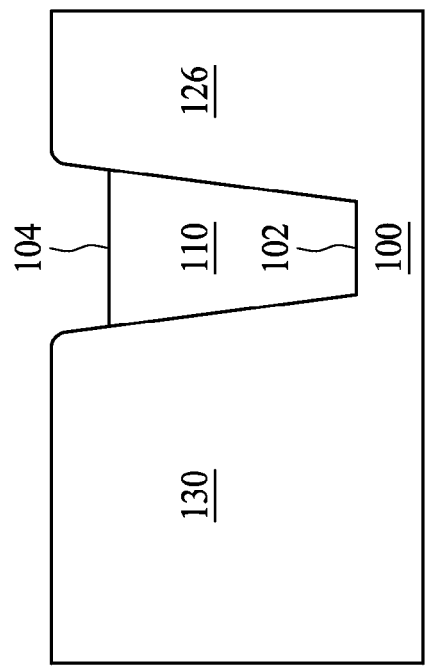
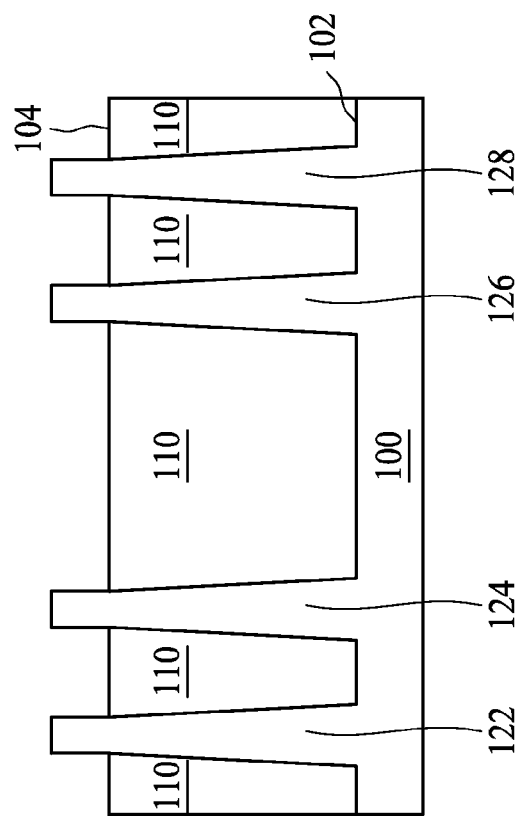

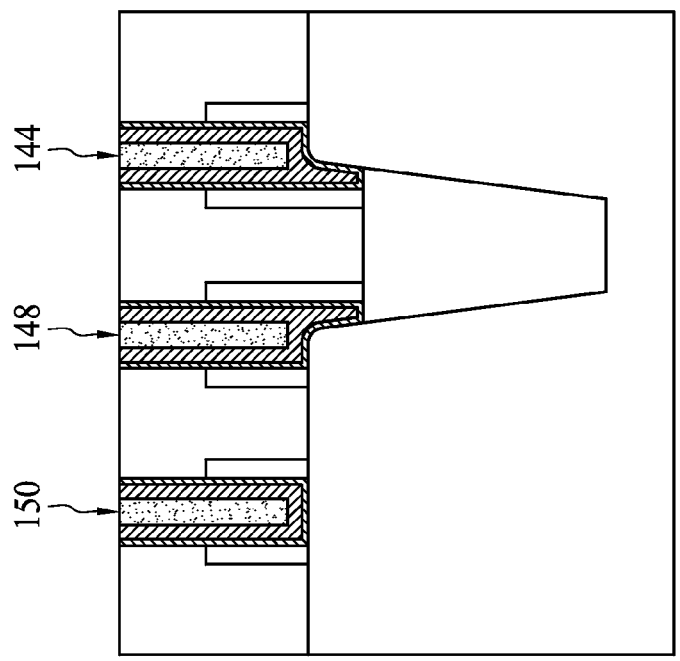
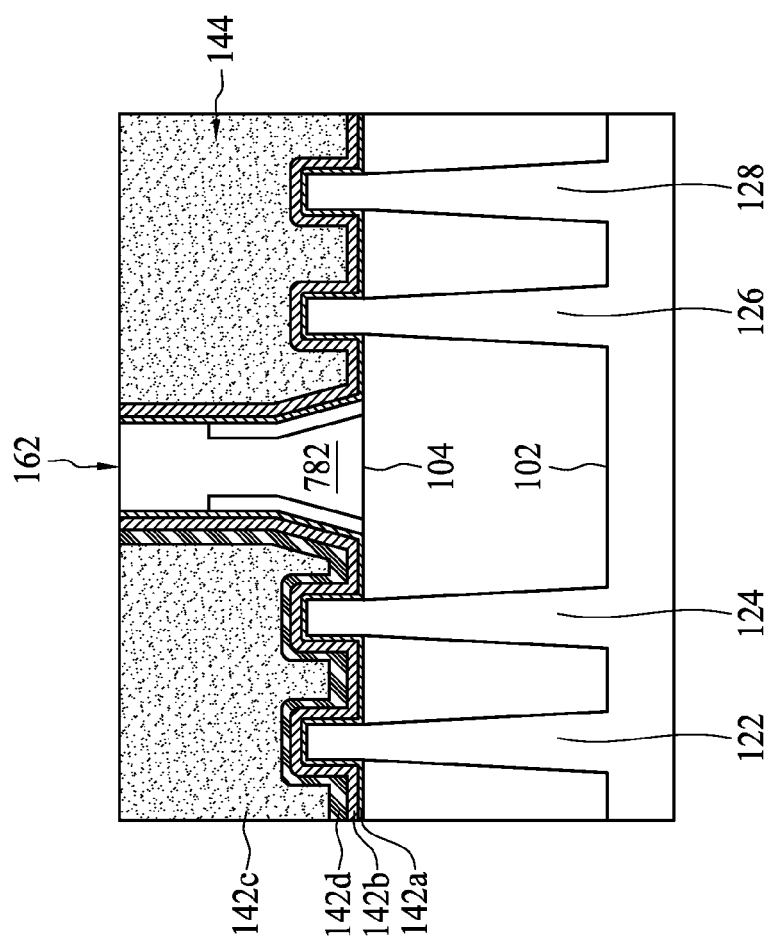
FIG. 9B
FIG. 9A

US 9,627,375 B2

INDENTED GATE END OF NON-PLANAR TRANSISTOR

TECHNICAL FIELD

The present disclosure is generally related to an indented gate end of a non-planar transistor.

BACKGROUND

The progress in producing integrated circuit chips with more functionalities per chip area has been promoted by continual scaling of device features. During the course of scaling down the device features, non-planar semiconductor devices such as fin field effect transistors (FinFETs) and nanowire field effect transistors (nanowire FETs) are developed to mitigate short channel effects, and to increase on-state current, thereby allowing further scaling of the device features. Accompanying with such development, critical dimensions of lines and spacings between the lines and ends of lines are also scaled down. However, the reduced spacings between gates of non-planar transistors and ends of gates may cause occurrences of bridging defects to increase, and leakage currents to tunnel through dielectric material in the spacings.

BRIEF DESCRIPTION OF THE DRAWINGS

The details of one or more embodiments of the disclosure are set forth in the accompanying drawings and the description below. Other features and advantages of the disclosure will be apparent from the description, drawings and claims.

FIG. 1E is a schematic diagram of corresponding profiles of the gate stack and the fin structure in a box 130 in FIG. 1C in accordance with some embodiments.

FIG. 2 is a schematic diagram of other corresponding profiles of the gate stack and the fin structure in a box 130' corresponding to the box 130 in FIG. 1C in accordance with some embodiments.

FIG. 3A to FIG. 9A are cross-sectional diagrams of the semiconductor structure along line A-A' in FIG. 1A formed by various operations in a replacement gate process in accordance with some embodiments.

FIG. 3B to FIG. 9B are cross-sectional diagrams of the semiconductor structure along line B-B' in FIG. 1A formed by various operations in the replacement gate process in accordance with some embodiments.

Like reference symbols in the various drawings indicate like elements.

DETAIL DESCRIPTION

Figure 1A:
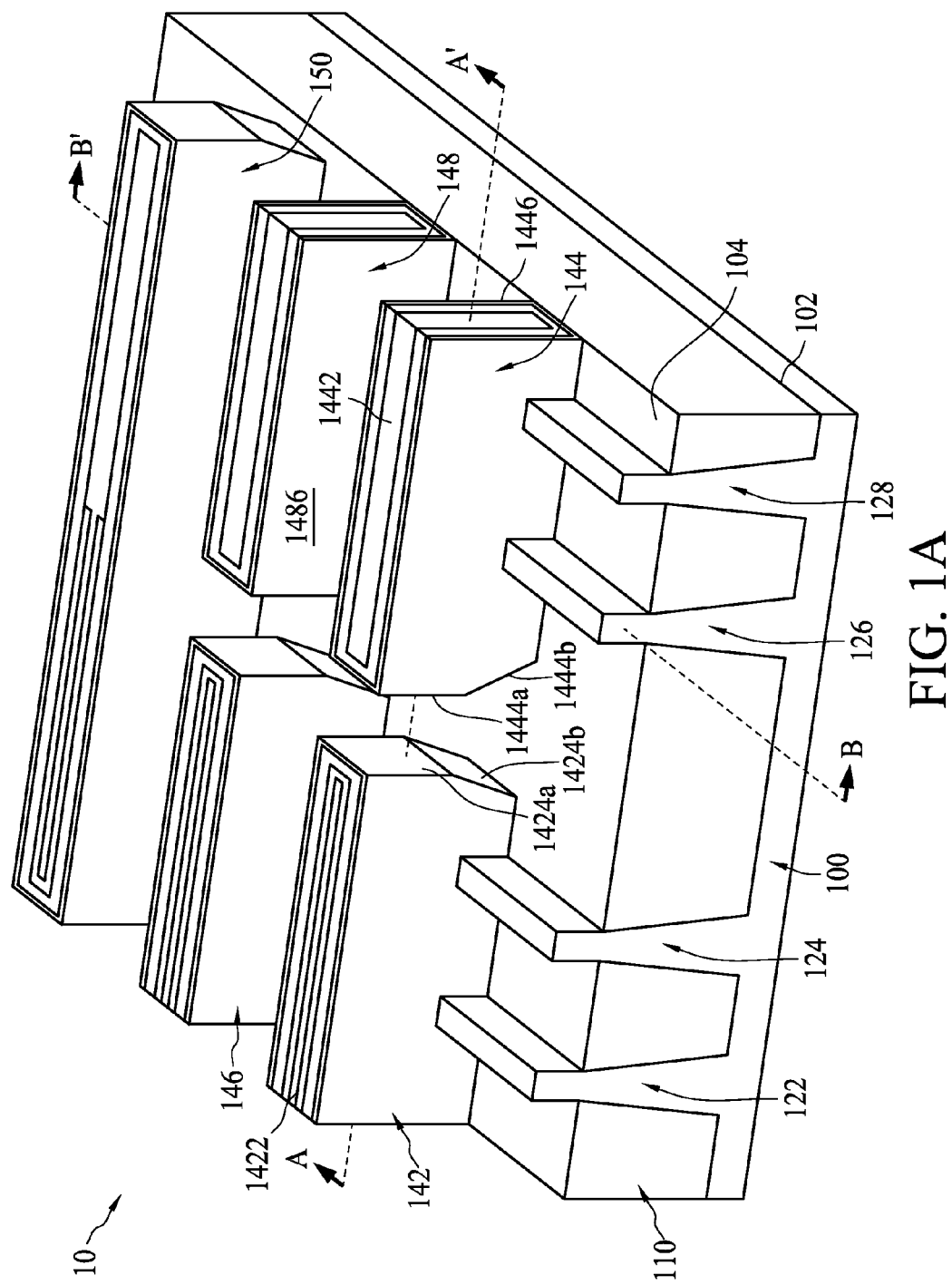
FIG. 1A is a schematic perspective diagram of a semiconductor structure with FinFETs having gate stacks formed by a replacement gate process and are adjacent in different ways in accordance with some embodiments.

Embodiments, or examples, of the disclosure illustrated in the drawings are now described using specific languages. It will nevertheless be understood that no limitation of the scope of the disclosure is thereby intended. Any alterations and modifications in the described embodiments, and any further applications of principles described in this document are contemplated as would normally occur to one of ordinary skill in the art to which the disclosure relates. Reference numbers may be repeated throughout the embodiments, but this does not necessarily require that feature(s) of one embodiment apply to another embodiment, even if they share the same reference number. It will be understood that when a feature is "formed over" another feature or a substrate, intervening features may be present. Furthermore, the terms "top" and "bottom" and the like are used to describe a relative distance of a feature with respect to a plane of a substrate over which the feature is formed being longer and shorter, respectively, and are not intended to limit the scope of the embodiments to any particular orientation.

Some embodiments have one or a combination of the following features and/or advantages. In some embodiments, a gate stack of a first non-planar transistor has an indented side wall at a gate end adjacent to a gate stack of a second non-planar transistor. Because the gate stack has an indented side wall, a bridging defect is less likely to occur between the gate stack of the first non-planar transistor and the second non-planar transistor. Further, a leakage current resulted from, for example, electrons tunneling through a thin insulating region between the gate stack of the first non-planar transistor and the gate stack of the second non-planar transistor is reduced. Furthermore, in a situation where the gate stack of the first non-planar transistor is formed by capping over a non-planar structure including a channel region, and the insulating gap, such as in a replacement gate process, void formation during capping is less likely to occur.

Figure 1B:
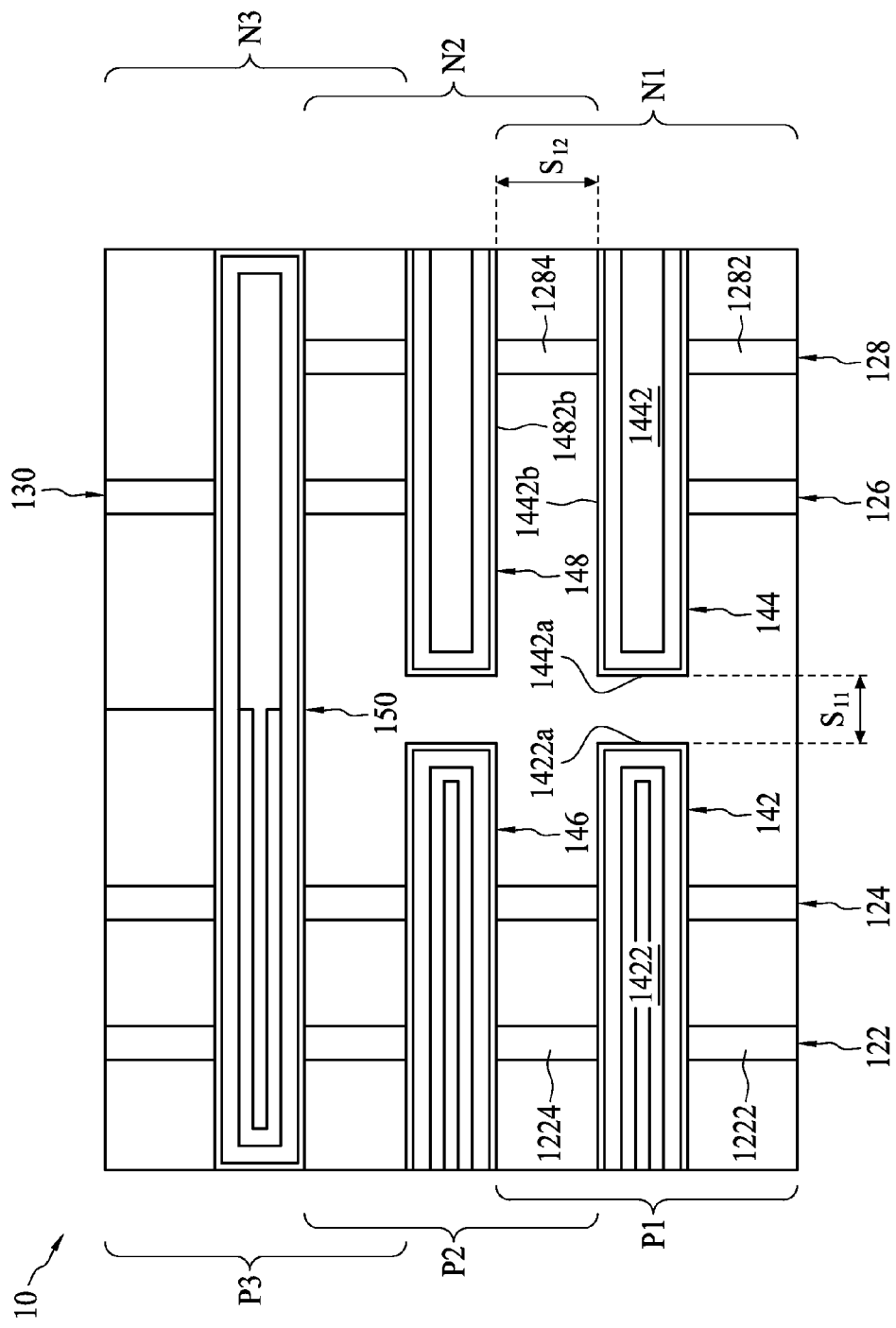
FIG. 1B is a schematic top-view diagram of the semiconductor structure in FIG. 1A.

FIG. 1A is a schematic perspective diagram of a semiconductor structure 10 with FinFETs having gate stacks 142, 144, 146, 148 and 150 formed by a replacement gate process and are adjacent in different ways in accordance with some embodiments. FIG. 1B is a schematic top-view diagram of the semiconductor structure 10 in FIG. 1A. The following description is described with reference to FIG. 1A unless otherwise provided. FIG. 1A and FIG. 1B illustrate, for example, the gate stacks 142 and 144 having adjacent and indented side walls 1424 and 1444 (only edges shown) at gate ends 1422a and 1442a (labeled in FIG. 1B), respectively. FIG. 1A and FIG. 1B further illustrate, for example, the gate stacks 144 and 148 having adjacent and non-indented side walls (only edges shown) and 1486 at gate sides 1442b and 1482b (labeled in FIG. 1B), respectively. A gate end and a gate side of a gate stack, such as the gate end 1442a and the gate side 1442b of the gate stack 144, are edges of a top surface of the gate stack, such as the top surface 1442 (labeled in both FIGS. 1A and 1B) of the gate stack 1442, that does not and does cross over a corresponding fin structure, such as the fin structure 128, respectively. In some embodiments, the semiconductor structure 10 includes a substrate 100, fin structures 122, 124, 126, 128 and 130 (shown in FIG. 1B), dielectric isolation regions 110 and the gate stacks 142, 144, 146, 148 and 150.

In some embodiments, the substrate 100 is a bulk silicon substrate in a crystalline structure. In other embodiments, the substrate 100 includes some other suitable elementary semiconductor such as diamond or germanium, some other suitable compound semiconductor, such as silicon carbide, gallium arsenic, gallium phosphide, indium phosphide, indium arsenide or indium antimonide, or some other suitable alloy semiconductor, such as silicon germanium, silicon germanium carbide, gallium arsenic phosphide or gallium indium phosphide, or combinations thereof. In some embodiments, the substrate 100 includes an epitaxial layer strained for performance enhancement. In some embodiments, the substrate 100 is doped with p-type dopants such as boron (B). In some embodiments, a silicon-on-insulator (SOI) substrate as illustratively shown in FIG. 13A is used instead of the bulk silicon substrate.

In some embodiments, the fin structures 122, 124, 126, 128 and 130 protrude from a surface 102 (labeled at the level of the surface) of the substrate 100. In some embodiments, the fin structures 122, 124, 126, 128 and 130 include silicon, some other suitable elementary semiconductor, compound semiconductor, or alloy semiconductor similar to examples provided for the substrate 100.

In some embodiments, dielectric isolation regions 110 such as shallow trench isolations (STIs) are formed on the surface 102 of the substrate 100 and surrounding the fin structures 122, 124, 126, 128 and 130. A surface over the substrate 100 and at the level of the top surfaces of the dielectric isolation regions 110 is defined as a surface 104. In some embodiments, the fin structures 122, 124, 126, 128 and 130 extend above the surface 104. The dielectric isolation regions 110 includes silicon oxide, silicon nitride, silicon oxy-nitride, fluoride-doped silicate (FSG), and/or a suitable low-k dielectric material. In some embodiments, dielectric isolation regions 110 are formed as deep trench isolations (DTIs) on the surface 102 of the substrate 100 and surrounding the fin structures 122, 124, 126, 128 and 130.

In some embodiments, the gate stacks 142, 144, 146, 148 and 150 are formed over the surface 104. The gate stack 142 wraps around portions (only edges shown) of the fin structures 122 and 124 which are defined as a channel region of a p-type FET P1 (labeled in FIG. 1B). The portions of the fin structures 122 and 124 on opposite sides of the gate stack 142, such as the portion 1222 (labeled in FIG. 1B) and the portion 1224 (shown in FIG. 1B) on opposite sides of the gate stack 142, include source and drain regions of the p-type FET P1. For the p-type FET P1, the channel region is n-type doped, and the source and drain regions are p-type doped. Similarly, a p-type FET P2 or P3 (both labeled in FIG. 1B) includes the gate stack 146 or 150 wrapping around portions of the fin structures 122 and 124, and a channel region, and source and drain regions defined with respect to the gate stack 146 or 150. The p-type FETs P1 and P2 have coupled source and drain regions, or shared source or drain regions at the portions (such as the portion 1224 shown in FIG. 1B) of the fin structures 122 and 124 between the gate stacks 142 and 146. The p-type FETs P2 and P3 are configured similarly as the p-type FETs P1 and P2.

The gate stack 144 wraps around a portion (only edges shown) of the fin structure 128 which is defined as a channel region of an n-type FET N1 (labeled in FIG. 1B). A portion 1282 (labeled in FIG. 1B) and a portion 1284 (shown in FIG. 1B) of the fin structure 128 on opposite sides of the gate stack 144 include source and drain regions of the n-type FET N1. For the n-type FET N1, the channel region is p-type doped, and the source and drain regions are n-type doped. The fin structure 126 includes one of source and drain regions of another FET which has a gate stack and the other of the source and drain regions not shown in the figures. The fin structure 126 extends to the gate stack 144 of the n-type FET N1 to, for example, increase capacitance at the source or drain region of the transistor constructed from the fin structure 126. Similarly, an n-type FET N2 or N3 (labeled in FIG. 1B) includes the gate stack 148 or 150 wrapping around portions of the fin structures 128 and 130 (shown in FIG. 1B), and a channel region, and source and drain regions defined with respect to the gate stack 148 or 150. The n-type FETs N1 and N2 have coupled source and drain regions or shared source or drain regions at the portion 1284 (shown in FIG. 1B) of the fin structure 128 between the gate stacks 144 and 148. As illustrated in FIG. 1B, the n-type FET N2 has one of the source and drain regions in the fin structure 128 extended to the gate stack 150, and the n-type FET N3 has one of the source and drain regions in the fin structure 130 extended to the gate stack 148, similar to the source or drain region in the fin structure 126 extended to the n-type FET N1.

The following description is described with reference to FIG. 1B unless otherwise provided. In some embodiments, the gate stack 142 of the p-type FET P1 and the gate stack 144 of the n-type FET N1 have adjacent side walls 1424 (shown in FIG. 1A) and 1444 (only edges shown in FIG. 1A) at the corresponding gate ends 1422a and 1442a, and have an end-to-end spacing $S_{11}$ between the gate ends 1422a and 1442a. When the end-to-end spacing $S_{11}$ is decreased with the decrease of a device feature size, i.e. a fin width, the gate stack 142 and the gate stack 144 is more likely tend to be connected by, for example sacrificial gate material residue or gate material residue, between the gate ends 1422a and 1442a, resulting in a bridging defect. Further, when the p-type FET P1 and the n-type FET N1 are in, for example, an OFF state, the voltage applied to the gate stack 142 of the p-type FET P1 is larger than the voltage applied to the gate stack 144 of the n-type FET N1, and the spacing $S_{11}$ between the gate ends 1422a and 1442a is so small that electrons in the gate stack 144 can tunnel through an insulating region 162 (described with reference to FIG. 1C) between the gate ends 1422a and 1442a and into the channel region in the fin structure 124, resulting in a leakage current. By forming the side wall 1424 or 1444 having a section 1424b or 1444b indented towards the fin structure 124 or 126 compared to an imaginary vertical plane aligned with the gate ends 1422a or 1442a, the residue causing a bridge defect is less likely existed between gate ends 1422a and 1442a. Further, the widened insulating region 162 between the sections 1424b and 1444b of the corresponding side walls 1424 and 1444 also reduce the leakage current due to a decreased tunneling probability.

In some embodiments, the gate stack 144 of the n-type FET N1 and the gate stack 148 of the n-type FET N2 have adjacent side walls 1446 (labeled at a cross section bordered by the side wall 1446 in FIG. 1A) and 1486 (shown in FIG. 1A) at the corresponding gate sides 1442b and 1482b, and have a gate-to-gate spacing $S_{12}$ between the gate sides 1442b and 1482b. Because the n-type FETs N1 and N2 have connected channel regions in the fin structure 128, electrons from one of the gate stacks 144 and 148 tunneling through an insulating region 166 (described with reference to FIG.

1D) between the gate stacks 144 and 148 to the channel region corresponding to the other of the gate stacks 144 and 148 is less of concern. Also, because the gate-to-gate spacing $S_{12}$ is determined with reference to a length of the source or drain region in the portion 1284 of the fin structure 128, the gate-to-gate spacing $S_{12}$ is typically larger than the end-to-end spacing $S_{11}$, and a bridging defect is more likely going to occur at the gate ends 1422a and 1442a than at the gate sides 1442b and 1482b. Therefore, in some embodiments, the adjacent side walls 1446 and 1486 are substantially vertical with respect to the surface 104.

The semiconductor structure 10 illustratively shown in FIGS. 1A and 1B is exemplary. For example, gate stacks of two n-type FETs or two p-type FETs can have indented side walls at gate ends, respectively. For example, the gate sides can have other kinds of profiles in combination with the indented profiles at the gate ends.

Figure 1D:
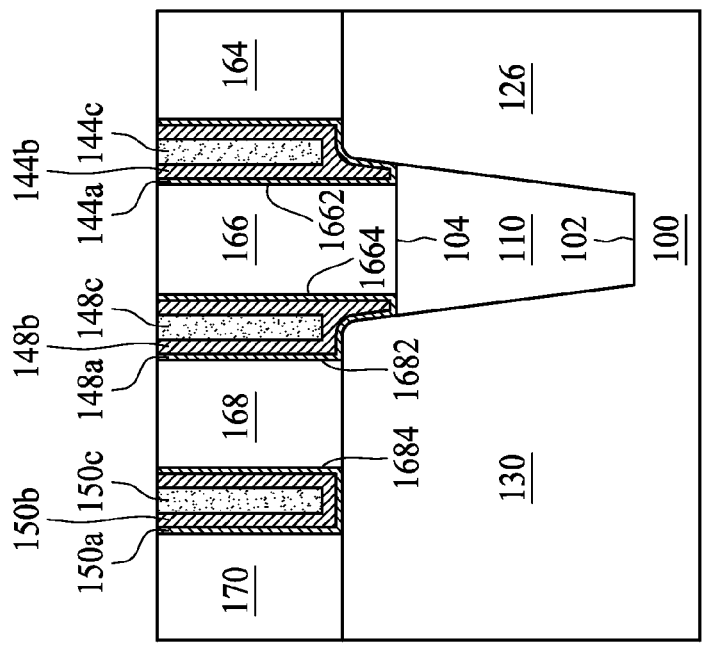
FIG. 1D is a schematic cross-sectional diagram along line B-B' in FIG. 1A in accordance with some embodiments.
Figure 1C:
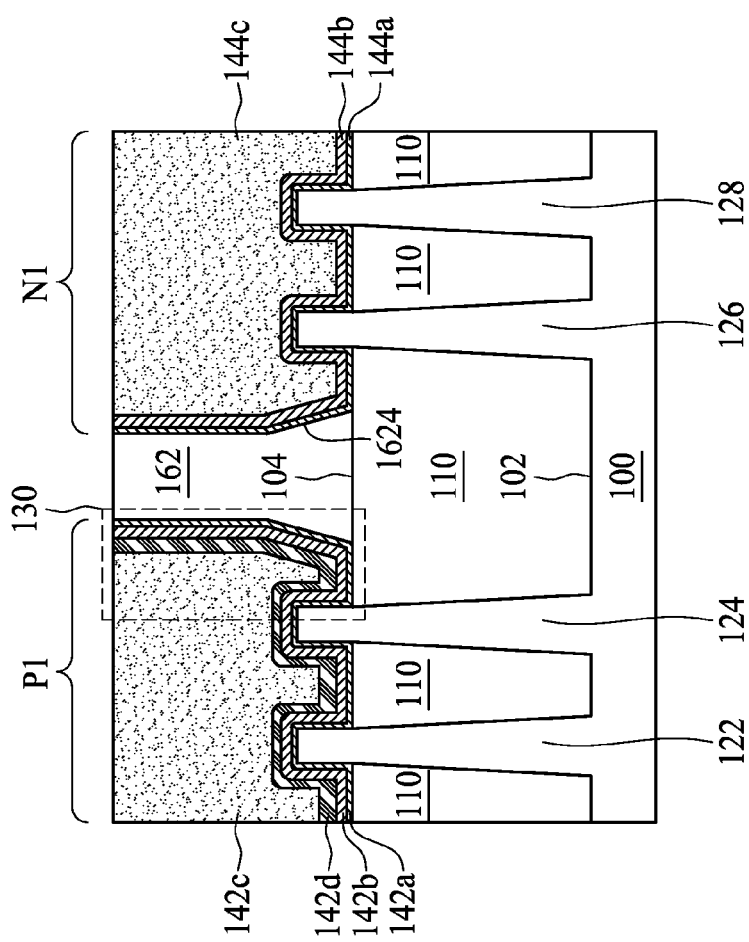
FIG. 1C is a schematic cross-sectional diagram along line A-A' in FIG. 1A in accordance with some embodiments.

FIG. 1C is a schematic cross-sectional diagram along line A-A' in FIG. 1A in accordance with some embodiments. FIG. 1C illustrates, the gate stack 142 or 144 formed as a capping structure over the fin structures 122 and 124, or 126 and 128 and an insulating region 162 between the gate stacks 142 and 144 by a replacement gate process described with references to FIGS. 3A to 9A. The insulating region 162 has a side wall 1622 or 1624 having the same profile as the side wall 1424 or 1444 (shown in FIG. 1A) of the gate stack 142 or 144.

As illustrated in FIG. 1C, the fin structures 122 and 124 of the p-type FET P1, the fin structure 126, and the fin structure 128 of the n-type FET N1 extend from the surface 102 of the substrate 100 and beyond the surface 104. For the replacement gate process, the insulating region 162 is first formed. In some embodiments, the side wall 1622 or 1624 of the insulating region 162 has a section tapered towards the fin structure 124 or 126 from a top of the section to a bottom of the section at the surface 104. In some embodiments, the insulating region 162 includes silicon oxide, silicon oxynitride, silicon carbide, and/or low-k dielectric material. In other embodiments described with references to FIGS. 9A and 9B, the gate stack 142 or 144 is enclosed by a spacer 772 or 774. In some embodiments, the insulating region 162 is etched away and replaced with suitable material after the gate stacks 142, 144, 148 and 150 are formed. The replaced insulating region 162 has the same shape as the insulating region 162 initially formed. The sequence of forming the insulating region 162 and the gate stacks 142 and 144 are provided here to illustrate some benefits of the indented profile and are not meant to limit the structure provided in FIG. 1C to a particular state during the fabrication process of the gate stacks 142 and 144.

In some embodiments, the gate stack 142 of the p-type FET P1 includes a gate dielectric layer 142a, work function metal layers 142b and 142d, and a fill metal 142c; the gate stack 144 of the n-type FET P1 includes a gate dielectric layer 144a, a work function metal layer 144b and a fill metal 144c. In some embodiments, after the insulating region 162 is formed, the gate dielectric layer 142a and the work function metal layers 142b and 142d wrapping around the channel regions of the corresponding fin structures 122 and 124, and covering the surface 104 and the side wall 1622 of the insulating region 162 are formed in a substantially conformal manner. A fill metal 142c caps over the work function metal layers 142b and 142d. Therefore, a trench between the fin structure 124 and the side wall 1622 of the insulating region 162 is filled by the conformal layers 142a, 142b and 142d, and the fill metal 142c. Because the side wall 1622 of the insulating region 162 has the section tapered towards the fin structure 124 from top to bottom, the side wall 1622 forming the trench is positively sloped. As a result, a chance of forming voids during filling the trench is reduced. The gate stack 144 of the n-type FET N1 is formed differently in some respects exemplarily provided below and are otherwise formed similarly. Further, as described with references to FIGS. 1A and 1B, the insulating region 162 is gradually widened in a portion bordered by the tapered sections of the corresponding side walls 1622 and 1624, thereby reducing the susceptibility of the p-type FET P1 and the n-type FET N1 to a bridge defect, and the p-type FET P1 or the n-type FET N1 to a leakage current.

In some embodiments, the gate dielectric layer 142a or 144a includes a high-k dielectric material such as $HfO_2$, HfErO, HfLaO, HfYO, HfGdO, HfAlO, HfZrO, HfTiO, HfTaO, $ZrO_2$, $Y_2O_3$, $La_2O_5$, $Gd_2O_5$, $TiO_2$, $Ta_2O_5$, or SrTiO. In some embodiments, an interfacial layer (not shown) is formed between the fin structures 122 and 124, or 126 and 128, and the gate dielectric layer 142a or 144a. In some embodiments, the interfacial layer is formed of chemical oxide, thermal oxide, silicon oxynitride, or the like.

In some embodiments, to achieve desired threshold voltages for the p-type FET P1 and the n-type FET N1, it is preferred to adjust a work function of the gate stack 142 of the p-type FET P1 close to the valence band edge of the semiconductor material in the corresponding channel region, and it is preferred to adjust a work function of the gate stack 144 for the n-type FET N1 close to the conduction band edge of the semiconductor material in the corresponding channel region. Therefore, the gate stack 142 of the p-type FET P1 and the gate stack 144 of the n-type FET N1 have different composition of layers. In some embodiments, the n-type FET N1 includes one or more work function metal layers (exemplarily shown as the layer 144b) to tune the work function of the gate stack 144 to be close to the conduction band edge of silicon, which is about 4.1 eV. Examples of such work function metal material include TaC, TaN, TiN, TaAlN, TaSiN, or combinations thereof. The p-type FET P1 includes more work function metal layers (exemplarily shown as the layers 142b and 142d) than that of the n-type FET N1 to tune the work function of the gate stack 142 to be close to the valence band edge of silicon, which is about 5.2 eV. Examples of such work function metal material include tungsten nitride, ruthenium oxynitride, molybdenum nitride, or combinations thereof.

In some embodiments, the fill metal 142c or 144c serve as the main conductive portion of the gate stack 142 or 144. In some embodiments, the fill metal 142c or 144c has a resistance lower than that of the one or more work function metal layers 142b and 142d, or 144c. In some embodiments, the fill metal 142c or 144c includes W, Al, Cu, or combinations thereof.

The composition of layers in the gate stack 142 or 144 is exemplary. For example, the number of high-k dielectric layers, work function metal layers can be different. Other layers such as a blocking layer, a glue layer, a polysilicon layer for forming a composite gate, a stressor material-containing layer, can be present. Further, a layer, such as the gate dielectric layer 142a or 144a or the stressor material-containing layer, in the gate stack 142 or 144 can be formed such that it is not conformally deposited over the fin structures 122 and 124, or 126 and 128 and the side wall 1622 or 1624 of the insulating region 162, and can cover selectively. Therefore, the side wall 1424 or 1444 (shown in FIG. 1A) of the gate stack 142 can be composed by multiple layers instead of one layer shown in FIG. 1C.

FIG. 1D is a schematic cross-sectional diagram along line B-B' in FIG. 1A in accordance with some embodiments. FIG. 1D illustrates the adjacent gate sides of the gate stack 144 and 148, and 148 and 150, which conform to side walls 1662 and 1664 of an insulating region 166, and side walls 1682 and 1684 of an insulating region 168 having vertical profiles, respectively. As illustrated in FIG. 1D, the fin structures 126 and 130 extend from the surface 102 of the substrate 100 and beyond the surface 104. The fin structure 126 has the source or drain region of the adjacent transistor extended to the gate stack 144. The fin structure 130 and the gate stack 150 are portions of the n-type FET N3 (labeled in FIG. 1B), and the fin structure 130 has the source or drain region extended to the gate stack 148.

For the replacement gate process, insulating regions 164, 166, 168 and 170 are first formed. Unlike the insulating region 162 between the gate ends 1422*a* and 1442*a* (both labeled in FIG. 1B) having side walls 1622 and 1624 with the corresponding tapering sections, the insulating region 166, and similarly the insulating region 168, between the gate sides 1442*b* and 1482*b* (both labeled in FIG. 1B) have the side walls 1662 and 1664 with the vertical profiles. The exemplary materials for constructing the insulating regions 164, 166, 168 or 170 and the alternative implementation with spacers are similar to those of the insulating region 162 and are omitted here. Further, similar to FIG. 1C, the sequence for forming the insulating region 164, 166, 168 and 170 and the gate stacks 144, 148, 150 are provided here to illustrate some benefits of the indented profile and are not meant to limit the structure provided in FIG. 1D to a particular state during the fabrication process of the gate stacks 144, 148 and 150.

Similar to the gate stack 144 described with reference to FIG. 1C, the gate stack 148 or 150 includes a gate dielectric layers 148*a* or 150*a*, a work function metal layer 148*b* or 150*b*, and a fill metal 148*c* or 150*c*. In some embodiments, the gate dielectric layer 144*a*, 148*a* or 150*a* is formed conforming to the vertical profile of the side wall 1662 of the insulating region 166, the vertical profiles of the side wall 1664 of the insulating region 166 and the side wall 1682 or the insulating region 168, or the vertical profile of the side wall 1684 of the insulating region 168. The work function metal layer 144*b*, 148*b* or 150*b* is conformally formed over the gate dielectric layer 144*a*, 148*a* or 150*a*. The fill metal 144*c*, 148*c* or 150*c* fills remaining space between the insulating regions 164 and 166, 166 and 168, or 168 and 170. Therefore, the gate stack 144, 148 or 150 has vertical profiles for the side walls at gate sides. Further details and other implementations of the gate dielectric layer, the work function metal layer and the fill metal are described with reference to FIG. 1C and are omitted here.

FIG. 1E is a schematic diagram of corresponding profiles of the gate stack 142 and the fin structure 124 in a box 130 in FIG. 1C in accordance with some embodiments. FIG. 1E illustrates characteristics of the corresponding profiles of the gate stack 142 and the fin structure 124. In some embodiments, at the level of the surface 104, the side wall 1424 of the gate stack 142 has a distance $D_{11}$ from an imaginary vertical plane 132 intersecting the fin structure 124 at at least a line, and at the level of the top surface 1422 of the gate stack 142, the side wall 1424 has a distance $D_{12}$ from the imaginary vertical plane 132. The imaginary vertical plane 132 is standing vertically with respect to the surface 104. The distances $D_{11}$ and $D_{12}$ are determined by moving the imaginary vertical plane 132 from the side wall 1424 towards the fin structure 124 and when the imaginary vertical plane 132 first intersects with the fin structure 124, stopping moving the imaginary vertical plane 132, and measuring distances between the side wall 1424 and the imaginary vertical plane 132 at the level of the surface 104 and the level of the top surface 1422 as the distances $D_{11}$ and $D_{12}$, respectively. In some embodiments, the fin structure 124 above the surface 104 has a rectangular profile. As the imaginary vertical plane 132 is moving toward the fin structure 124, the fin structure 124 and the imaginary vertical plane 132 first intersect at a side wall 1242 of the fin structure 124. In other embodiments (not shown), the fin structure 124 above the surface 104 has a triangular profile. As the imaginary vertical plane 132 is moving toward the fin structure, the fin structure 124 and the imaginary vertical plane 132 first intersect at a line on the sloped side wall 1242. The distance $D_{11}$ is shorter than the distance $D_{12}$ and is greater than 0 nm.

In some embodiments, the side wall 1424 has the section 1424*b* tapering from a top edge of the section 1424*b* having the distance $D_{12}$ with respect to the imaginary vertical plane 132 to a bottom edge of the section having the distance $D_{11}$ with respect to the imaginary vertical plane 132. In some embodiments, the top edge of the section 1424*b* has a height $H_{11}$ with respect to the surface 104, and the bottom edge of the section 1424*b* is located at the surface 104. In some embodiments, the height $H_{11}$ of the section 1424*b* is as high as a height $H_{12}$ of the top surface 1422. Therefore, the entire side wall 1424 is tapering towards the fin structure 124 from the top surface 1422 to the surface 104. In other embodiments, the height $H_{11}$ of the section 1424*b* is shorter than the height $H_{12}$ of the top surface 1422. Therefore, the side wall 1424 also has a substantially vertical section 1424*a* above the tapering section 1424*b*. In some embodiments, the height $H_{11}$ of the section 1424*b* is between 0 nm and 2000 nm. Further, in some embodiments, the tapering section 1424*b* of the side wall 1424 has an inclined profile.

In addition, in some embodiments, the bottom edge of the tapering section 1424*b* is located above the surface 104, and another vertical section or another tapering section with a smaller slope compared to the tapering section 1424*b* is located below the tapering section 1424*b*. The slope is determined with respect to the origin located at the lower left corner of the box 130.

FIG. 2 is a schematic diagram of other corresponding profiles of the gate stack 142' and the fin structure 124 in a box 130' corresponding to the box 130 in FIG. 1C in accordance with some embodiments. Compared to the corresponding profiles of the gate stack 142 and the fin structure 124 in FIG. 1E, the tapering section 1424*b'* of the side wall 1424' has a curved profile. The curved profile has a continuously decreasing slope from the top to the bottom of the profile.

FIG. 3A to FIG. 9A are cross-sectional diagrams of the semiconductor structure 10 along line A-A' in FIG. 1A formed by various operations in a replacement gate process in accordance with some embodiments. FIG. 3B to FIG. 9B are cross-sectional diagrams of the semiconductor structure 10 along line B-B' in FIG. 1A formed by various operations in the replacement gate process in accordance with some embodiments. FIGS. 3A and 3B illustrate the fin structures 122, 124, . . . and 130 and the dielectric isolation regions 110 separating the fin structures 122, 124, . . . and 130 formed on the substrate 100 and in accordance with some embodiments. In some embodiments, the structure of the fin structures 122, 124, . . . and 130 standing on the substrate 100 is formed by etching trenches in, for example, a bulk silicon substrate. The surface 102 of the substrate 100 is located at a level of the bottom surfaces of the trenches. Between the trenches are the fin structures 122, 124, . . . and 130 extending from the surface 102 of the substrate 100. Further, the trenches are filled with the dielectric material as described with references to FIGS. 1A and 1B to form the dielectric isolation regions 110. In some embodiments, the dielectric isolation regions 110 are further etched so that the fin structure 122, 124, . . . and 130 extend beyond the surface 104 at the level of top surfaces of the dielectric isolation regions 110. In other embodiments, the portions of the fin structure 122, 124, . . . and 130 extended beyond the surface 104 is epitaxially grown.

Figure 4B:
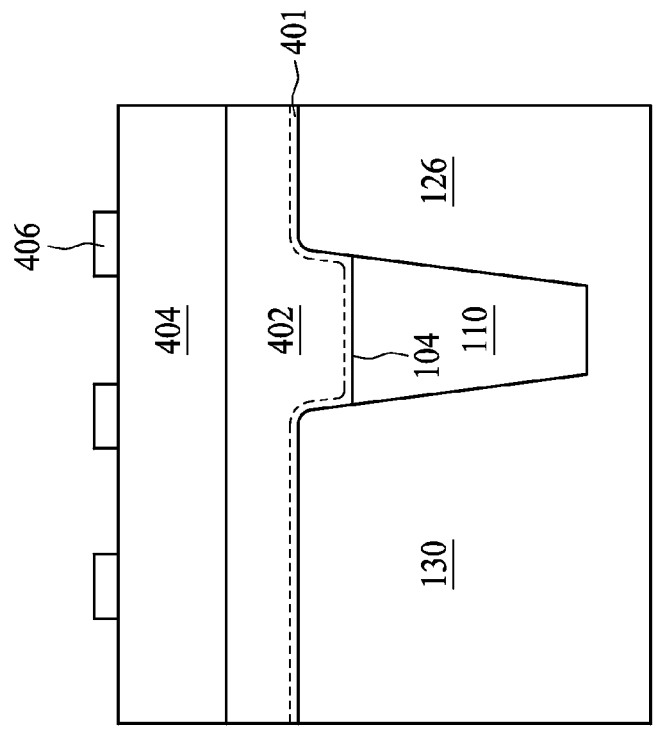
Figure 4A:
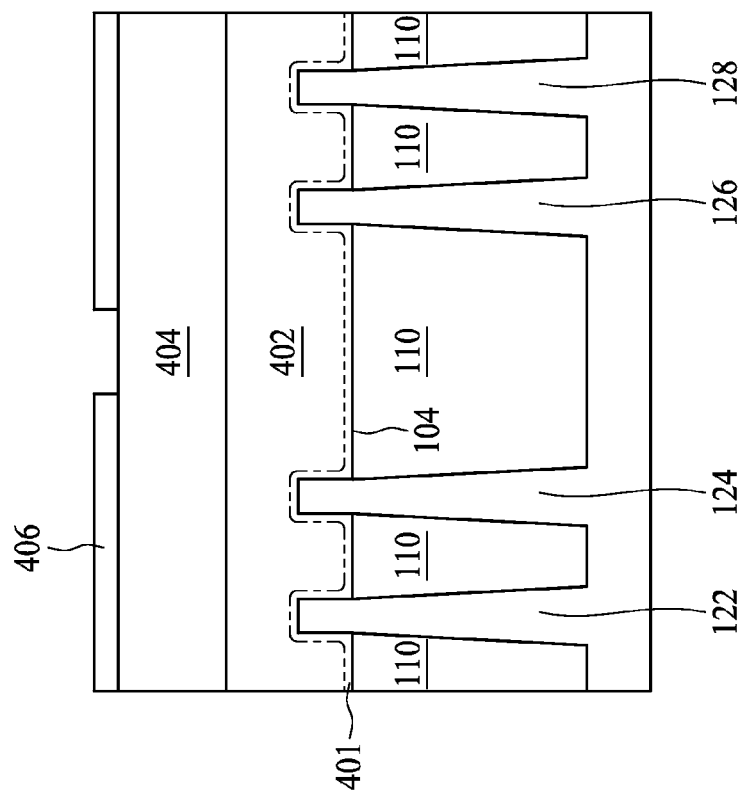

FIGS. 4A and 4B illustrate a sacrificial gate dielectric layer 401, a sacrificial gate layer 402, one or more hard mask layers 404, and a photoresist mask 406 for forming gate stack patterns 642, 644, 648 and 650 (shown in FIGS. 6A and 6B) in accordance with some embodiments. In some embodiments, a sacrificial gate dielectric layer 401 is blanket deposited over the surface 104 and surfaces of the fin structures 122, 124, . . . , and 130 extended beyond the surface 104, and a sacrificial gate layer 402 is formed on the sacrificial gate dielectric layer 402. In other embodiments, a sacrificial gate dielectric layer (not shown) is grown on the surfaces of the fin structures 122, 124 . . . , and 130 extended beyond the surface 104, and a sacrificial gate layer 402 is formed on the surface 104, and the sacrificial gate dielectric layer. In still other embodiments, the sacrificial gate dielectric layer 401 is not formed, and the sacrificial gate layer 402 is blanket deposited on the surface 104 and surfaces of the fin structures 122, 124, . . . , and 130 extended beyond the surface 104. When the fin structures 122, 124, . . . , and 130, and the sacrificial gate layer 402 are made of the same material such as silicon, the sacrificial gate dielectric layer 401 protects the fin structures 122, 124, . . . , and 130 when the sacrificial gate layer 402 is being removed. In some embodiments, the sacrificial gate dielectric layer 401 includes HfO, TiN, $SiO_2$, $Si_3N_4$, SiON, or combinations thereof. In some embodiments, a height of the sacrificial gate dielectric layer 401 is between 5 Å to 50 Å. In some embodiments, the sacrificial gate layer 402 includes polysilicon, or $Si_3N_4$. In some embodiments, a height of the sacrificial gate layer 402 is between 300 Å to 2000 Å In some embodiments, the sacrificial gate layer 402 is further planarized by, for example, chemical mechanical planarization (CMP) in order to form a smooth top surface for the sacrificial gate layer 402. The smooth top surface will aid in the subsequent patterning of the sacrificial gate layer 402.

After deposition and planarization (if performed) of the sacrificial gate layer 402, the one or more hard mask layers 404 is deposited on the sacrificial gate layer 402. The one or more hard mask layers 404 are formed such that during patterning the sacrificial gate layer 402, the one or more hard mask layer 404 will not be significantly etched or eroded. The one or more hard mask layer 404 help improve the anisotropic patterning of the sacrificial gate layer 402 and are utilized to seal a top surface of the patterned sacrificial gate layer 402 during process operations performed with respect to the source and drain regions of the fin structures. In some embodiments, the sacrificial gate layer 404 is formed of polysilicon, and the one or more hard mask layers 404 includes $SiO_2$, $Si_3N_4$, or SiON. In other embodiments, the sacrificial gate layer 404 is formed of $Si_3N_4$ and the one or more hard mask layers includes $SiO_2$, or SiON. In other embodiments, the total height of the sacrificial gate dielectric layer 401 (if exists), the sacrificial gate layer 402 and the one or more hard mask layers 404 is approximately equal to a height of the gate stacks 142, 144, 148 and 150 illustrated in FIGS. 9A and 9B. In some embodiments, a height of the one or more hard mask layers 404 is between 300 Å to 1000 Å.

In some embodiments, for patterning the one or more hard mask layers 404 and the sacrificial gate layer 402 to form the gate stack patterns 642, 644, 648 and 650, a photoresist layer is blanket deposited on the one or more hard mask layers 404. Photolithography techniques are then used to pattern the photoresist layer into the photoresist mask 406 which defines the locations where the gate stack patterns 642, 644, 648 and 650 are desired.

Figure 5B:
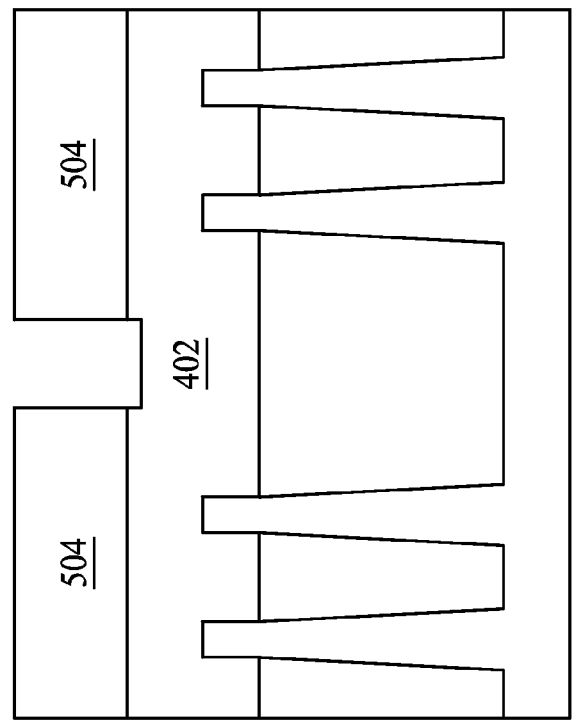
Figure 5A:
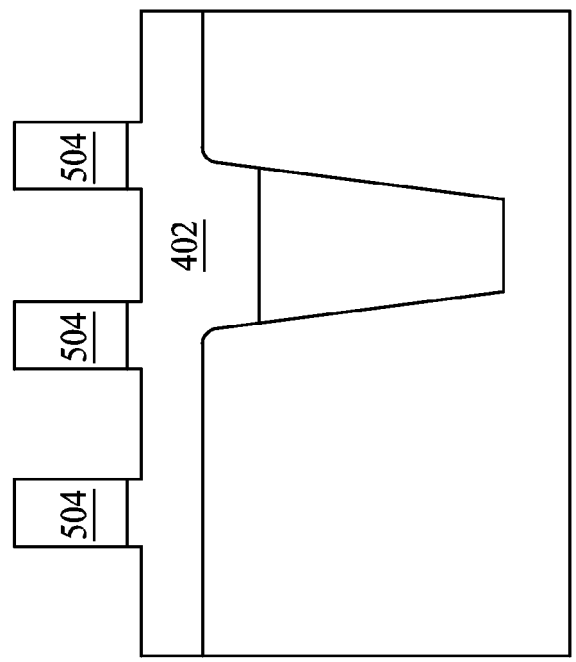

FIGS. 5A and 5B illustrate the one or more hard mask layers 404 patterned into a hard mask 504 in accordance with some embodiments. The one or more hard mask layers 404 in FIGS. 4A and 4B are etched in alignment with the photoresist mask 406 to form the hard mask 504. In some embodiments, the one or more hard mask layers 404 are patterned using a reactive ion etching.

Figure 6B:
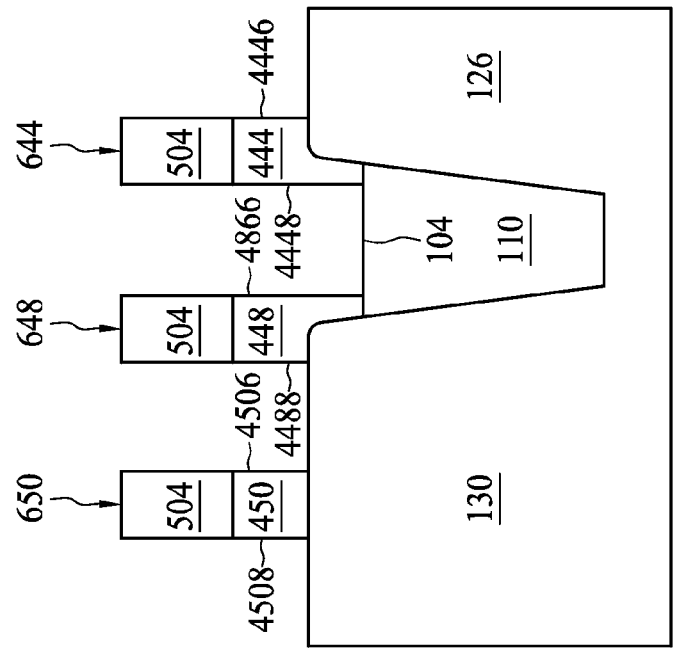
Figure 6A:
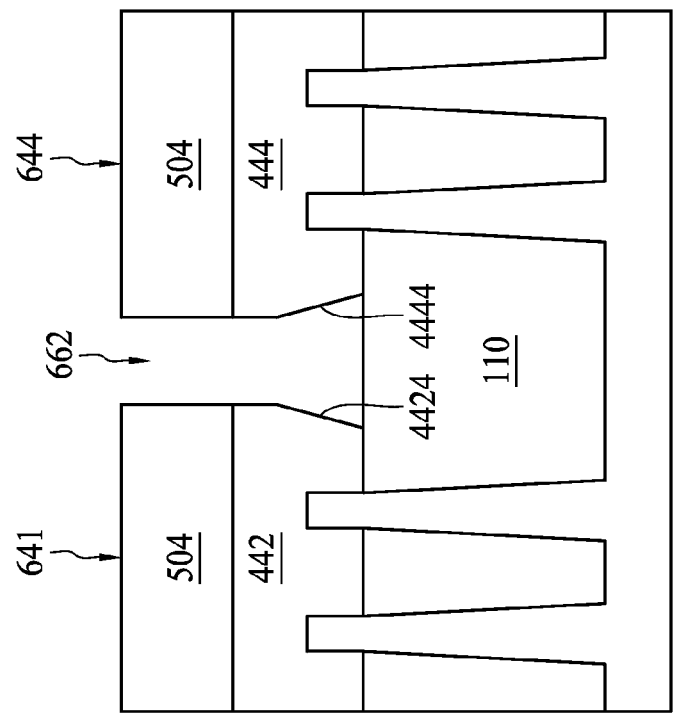

FIGS. 6A and 6B illustrate the gate stack pattern 642, 644, 648 and 650 formed after patterning the sacrificial gate layer 404 (shown in FIG. 5A) in accordance with some embodiments. The sacrificial gate layer 404 is etched in alignment with the hard mask 504. The hard mask 504 is formed of the material which does not significantly etch or erode during the etch of a sacrificial gate electrode, so a pattern formed in the hard mask is transferred to the sacrificial gate layer 404 to form sacrificial gate electrodes 442, 444, 448 and 450. In some embodiments, the sacrificial gate layer 404 is overetched until the underlying surface 104, sacrificial gate dielectric layer 401 (if exists) or the fin structure 126 or 130 is reached, and a side wall 4424 of the sacrificial gate electrode 442 and a side wall 4444 of the sacrificial gate electrode 444 are indented. Side walls 4446 and 4448, 4486 and 4488, and 4506 and 4508 of the corresponding sacrificial gate electrodes 444, 448 and 450 have substantially vertical profiles. In some embodiments, the sacrificial gate dielectric layer 401 is then patterned in alignment with the sacrificial gate electrodes 442, 444, 448 and 450. Gate stack pattern 642, 644, 648 or 650 formed by a stack of the patterned gate dielectric layer 401 (if exists), the sacrificial gate electrode 442, 444, 448 or 450 and the hard mask 504 have side walls having substantially the same profiles as the corresponding gate stacks 142, 144, 148 and 150 described with references to FIG. 1A to FIG. 2.

In some embodiments, the sacrificial gate layer 402 is made of polysilicon, and the hard mask 504 is made of $SiO_2$, $Si_3N_4$ or SiON, and a reactive ion etch with a gas mixture comprising gases selected from the group consisting of $CH_4$, $CF_4$, $CHF_3$, $CH_2F_2$, $SF_6$, $NF_3$, $SF_6$, $N_2$, $H_2$, $O_2$, Ar and combinations thereof is used to etch the sacrificial gate layer 402. Further, a gas ratio of 1 to 50 between selected gases is used. In some embodiments, the sacrificial gate layer 402 is made of $Si_3N_4$, and the hard mask 504 is made of $SiO_2$ or SiON, and a reactive ion etch with a gas mixture comprising gases selected from the group consisting of $CH_4$, $CF_4$, $CHF_3$, $CH_2F_2$, $SF_6$, $NF_3$, $SF_6$, $N_2$, $H_2$, $O_2$, Ar, and combinations thereof is used to etch the sacrificial gate layer 402. Further, a gas ratio of 1 to 50 between selected gases is used.

Figure 7B:
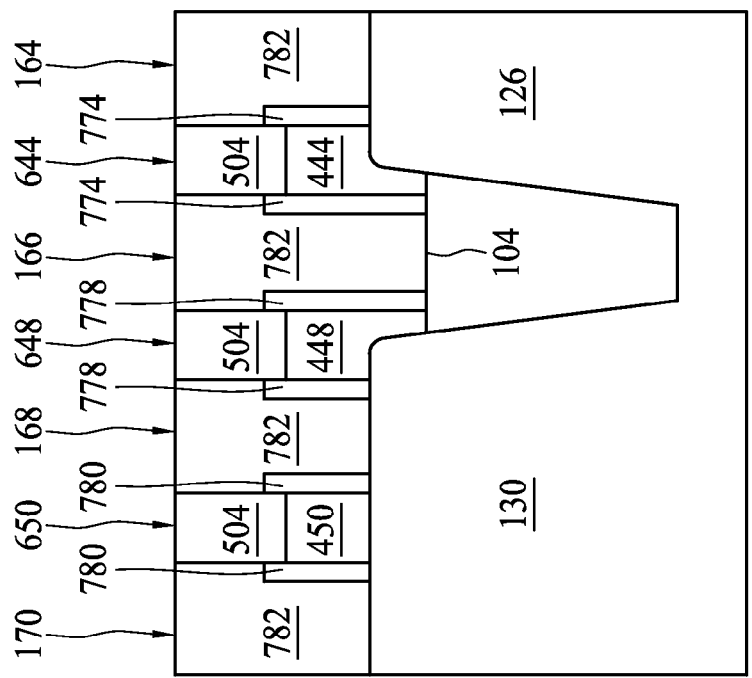
Figure 7A:
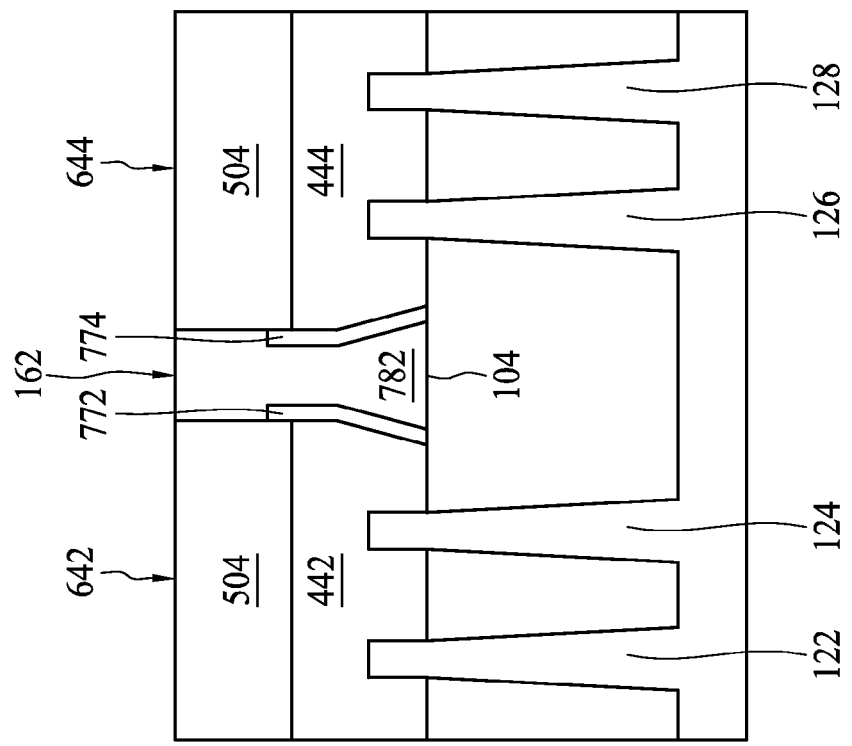

FIGS. 7A and 7B illustrate spacers 772, 774, 778 and 780 and an ILD layer 782 filling space surrounding side walls of the gate stack patterns 642, 644, 648 and 650 in accordance with some embodiments. In some embodiments, spacers 772, 774, 778 and 780 are formed by blanket depositing a conformal dielectric film over the surface 104, and then anisotropically etching and over etching, if necessary, the conformal dielectric film to form the spacers 772 774, 778 and 780 running along and adjacent to the side walls of the corresponding gate stack pattern 642, 644, 648 and 650. In some embodiments, a height of the spacer 772, 774, 778 or 780 is larger than that of the sacrificial gate electrode 442, 444, 448 or 450 so that the sacrificial gate electrode 442, 444, 448 or 450 is encapsulated by the spacer 772, 774, 778 or 780 and the hard mask 504 during subsequent processing operations performed for the fin structures 122, 124, 126, 128 and 130. In other embodiments as illustratively shown in FIGS. 1C and 1D, the spacers 772, 774, 778 and 780 are not formed.

Then, the ILD layer 782 is blanket deposited over the surface 104 and planarized until a top surface of the ILD layer 782 is planar the hard mask 504. The insulating region 162, 164, 166, 168 or 170 has now been filled by the spacers 772 and 774, 774, 774 and 778, 778 and 780, or 780, and the ILD layer 782. The ILD layer 782 is formed of a material whereby the sacrificial gate electrode 442, 444, 448 or 450 and the hard mask 504 can be removed without significantly etching away the ILD layer 782. In some embodiments, the ILD layer 782 is sacrificial.

Figure 8B:
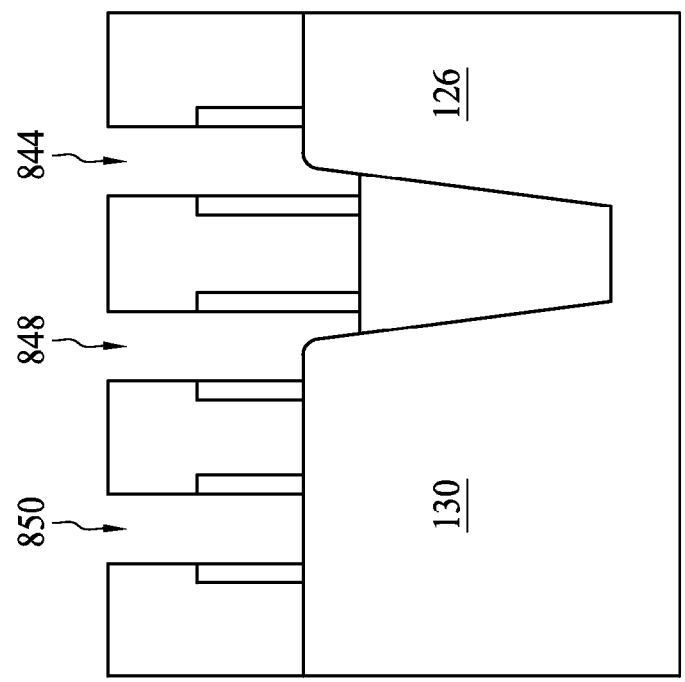
Figure 8A:
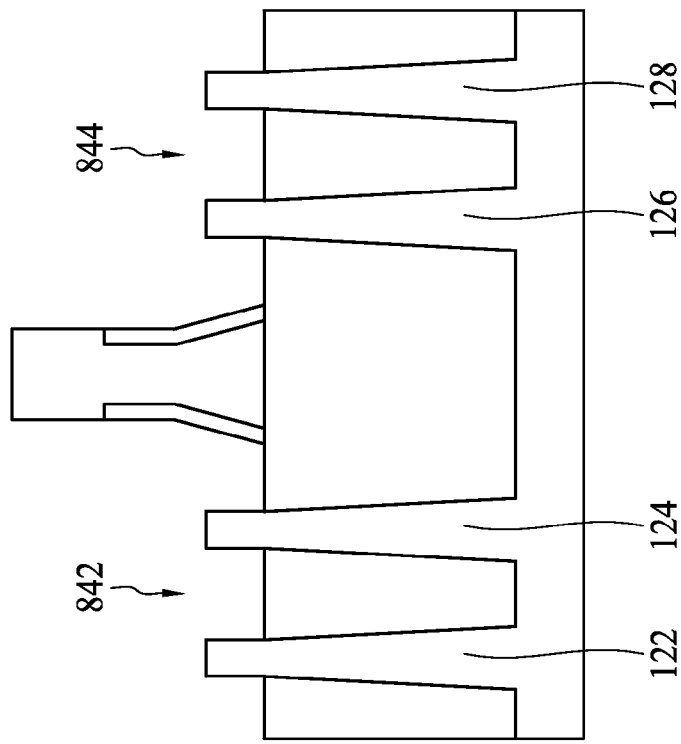

FIGS. 8A and 8B illustrate the gate stack patterns 642, 644, 648 and 650 in FIGS. 7A and 7B removed for forming replacement gate stacks 142, 144, 148 and 150 in FIGS. 9A and 9B in accordance with some embodiments. The hard mask 504 and the sacrificial gate electrodes 442, 444, 448 and 450 shown in FIGS. 7A and 7B are removed in sequence. Then, the patterned sacrificial gate dielectric layer 401, if exists, is removed. Removal of the gate stack patterns 642, 644, 648 and 650 exposes the underlying fin structures 122, 124, 126, 128 and 130, and forms the openings 842, 844, 848 and 850 where the gate stacks 142, 144, 148 and 150 shown in FIGS. 9A and 9B will be formed.

FIGS. 9A and 9B illustrate the gate stacks 142, 144, 148, and 150 formed in the openings 842, 844, 848 and 850 in accordance with some embodiments. In the following, the formation of the gate stack 142 is provided as an example. Other gate stacks 144, 148 and 150 are formed similarly. In some embodiments, one or more gate dielectric layers such as a gate dielectric layer 142a is conformally deposited on exposed surfaces of the fin structures 122 and 124, the surface 104, and a side wall of the insulating region 162. In other embodiments, the gate dielectric layer (not shown) is thermally grown on the exposed surfaces of the fin structures 122 and 124. As described with reference to FIG. 1C, the gate dielectric layer 142a includes a high-k dielectric material. The gate dielectric layer 142a can be formed by for example, chemical vapor deposition (CVD) or atomic layer deposition (ALD). Then, one or more work function metal layers such as layers 142b and 142d are conformally deposited over the gate dielectric layer 142a using, for example, CVD or ALD. Then, a fill metal 142c caps over the work function metal layers 142b and 142d and the insulating region 162 using, for example, CVD, ALD or sputtering. The fill metal 142c, the one or more work function metal layers 142b and 142d, and the one or more gate dielectric layers 142a formed on the top of the insulating region 162 is then removed by, for example, CMP. Further, in some embodiments, the ILD layer 782 is removed and replaced with another material for purposes such as creating stress to enhance the mobility of carriers in the p-type FET or n-type FET.

The embodiments described with references to FIGS. 1A to 9A are with respect to the gate stacks formed with the replacement gate process. However, the present disclosure is not limited to the gate stacks formed using the replacement gate process. In some embodiments, a gate stack with an indented side wall at a gate end is formed by a gate first process. A gate stack formed by the gate first process to be comparable to, for example, the gate stack 142 in FIG. 1A has the side wall having substantially the same indented profile as the side wall 1424, but constituted by different layers forming the gate stack instead one layer or a selected number of layers forming the gate stack 142, as described in further details in the following.

Figure 10B:
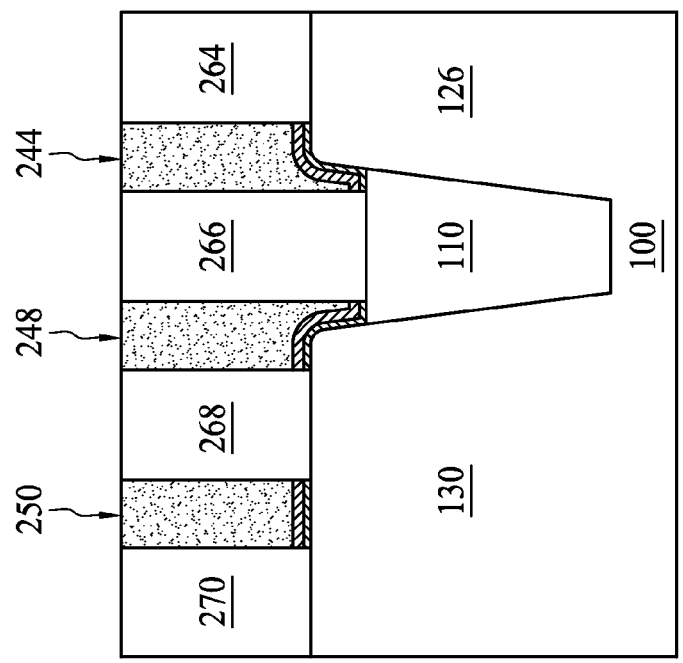
FIGS. 10A and 10B are cross-sectional diagrams of a semiconductor structure formed by a gate first process which is comparable to the semiconductor structure formed by the replacement gate process in FIG. 1A.
Figure 10A:
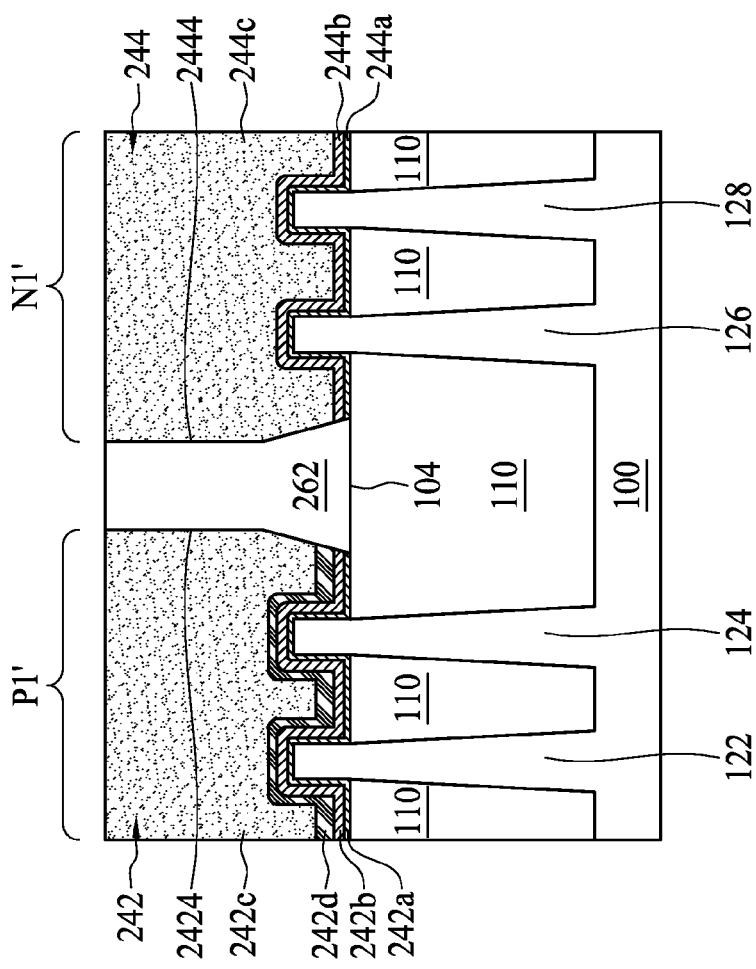

FIGS. 10A and 10B are cross-sectional diagrams of a semiconductor structure formed by the gate first process which is comparable to the semiconductor structure 10 formed by the replacement gate process in FIG. 1A. FIGS. 10A and 10B correspond to FIGS. 1C and 1D, respectively. A gate stack 242 of a p-type FET P1' includes a gate dielectric layer 242a, work function metal layers 242b and 242d, and a metal layer 242d. A gate stack 244 of an n-type FET N1' includes a gate dielectric layer 244a, a work function metal layer 244b and a metal layer 244c. Compared to the side wall 1424 or 1444 (labeled in FIG. 1A) of the gate stack 142 or 144, the side wall 2424 or 2444 of the gate stack 242 or 244 is formed by the different layers 242a, 242b, 242c, and 242d, or 244a, 244b, and 244c in the gate stack 242 or 244. Even though the side wall 2424 or 2444 and the side wall 1424 or 1444 are different in the layers constituting the side walls, the side wall 2424 or 2444 still has an indented profile similar to that of the side wall 1424 or 1444. As a result, an insulating region 262 between the gate stacks 242 or 244 has a gradually widened section bordered by the indented portions of the side walls 1424 and 1444. Therefore, the susceptibility of the p-type FET P1' and the n-type FET N1' to a bridge defect, and the p-type FET P1 or the n-type FET N1 to a leakage current are reduced.

Figure 11A:
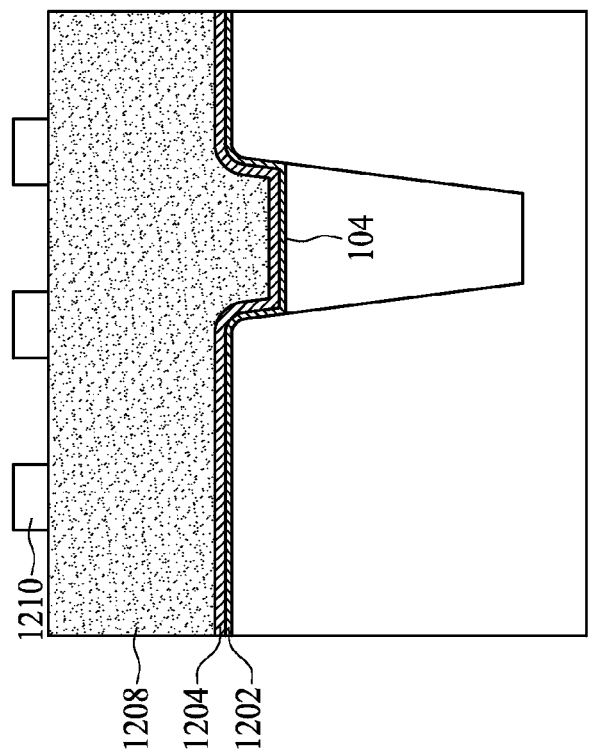
FIGS. 11A and 11B are cross-sectional diagrams of the semiconductor structure formed by operations prior to the operations to be described with references to FIGS. 10A and 10B in the gate first process in accordance with some embodiments.
Figure 11B:
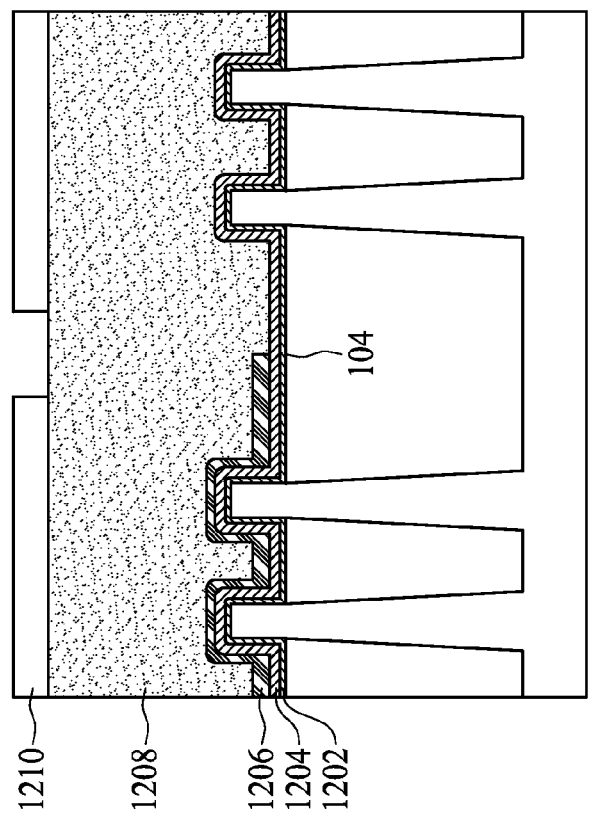

FIGS. 11A and 11B are cross-sectional diagrams of the semiconductor structure 10 formed by operations prior to the operations to be described with references to FIGS. 10A and 10B in the gate first process in accordance with some embodiments. FIGS. 11A and 11B illustrate metal layers 1208, 1206 and 1204, and a dielectric layer 1202 being patterned into gate stacks 242, 244, 248 and 250 shown in FIGS. 10A and 10B using the photomask 1210. In some embodiments, the dielectric layer 1202 is conformally deposited over the surface 104. The metal layers 1204 and 1206 are conformally deposited over the dielectric layer 1202. A portion of the metal layer 1206 corresponding to locations of the n-type FETs such as the n-type FET N1' shown in FIG. 10A is removed. The metal layer 1208 is blanket deposited over the metal layers 1204 and 1206. In some embodiments, the metal layer 1208 is further planarized by, for example, CMP to form a smooth top surface. A photoresist layer is then blanket deposited over the metal layer 1208, and patterned into the photomask 1210 using photolithography techniques. In some embodiments, one or more hard mask layers similar to the one or more hard mask layers 404 in FIGS. 4A and 4B can be formed between the metal layer 1208 and the photoresist mask 1210 to improve anisotropic patterning of the metal layers 1208, 1206 and 1204.

Referring to FIGS. 10A and 10B, the pattern of the photomask 1210 is then transferred to the metal layers 1208, 1206 and 1204 through an appropriate etching method such as a reactive ion etch. In some embodiments, the metal layers 1204, 1206 and 1208 are over-etched at gate ends until the underlying dielectric layer 1202 is reached, and the indented portion of the side wall 2424 or 2444 is formed. On the other hand, over-etching of the metal layers 1204, 1206 and 1208 creates vertical profiles for side walls at gate sides of the gate stack 244, a gate stack 248 or a gate stack 250. Then, the dielectric layer 1202 is patterned in alignment with the metal layers of the gate stack 242, 244, 248 and 250. Subsequently, insulating regions 262, 264, 266, 268 and 270 surrounding the gate stacks 242, 264, 266, 268 and 270 are filled with one or more interlayer dielectric materials.

The embodiments described with references to FIGS. 1A to 11B are with respect to the gate stack wrapping around a top surface and two opposite side walls of a portion of the fin structure. However, the present disclosure is not limited to such implementation of the gate stacks. In some embodiments, a gate stack with an indented side wall at a gate end is formed wrapping around the top surface, the two opposite side walls and a bottom surface of the portion of the fin structure. In some embodiments described with references to FIGS. 12A and 12B, a gate stack with an indented side wall at a gate end wraps all around a surface of a portion of a nanowire. Therefore, the gate stacks of different types of non-planar transistors each having the indented side wall at the gate end are within the contemplated scope of the present disclosure.

Figure 12A:
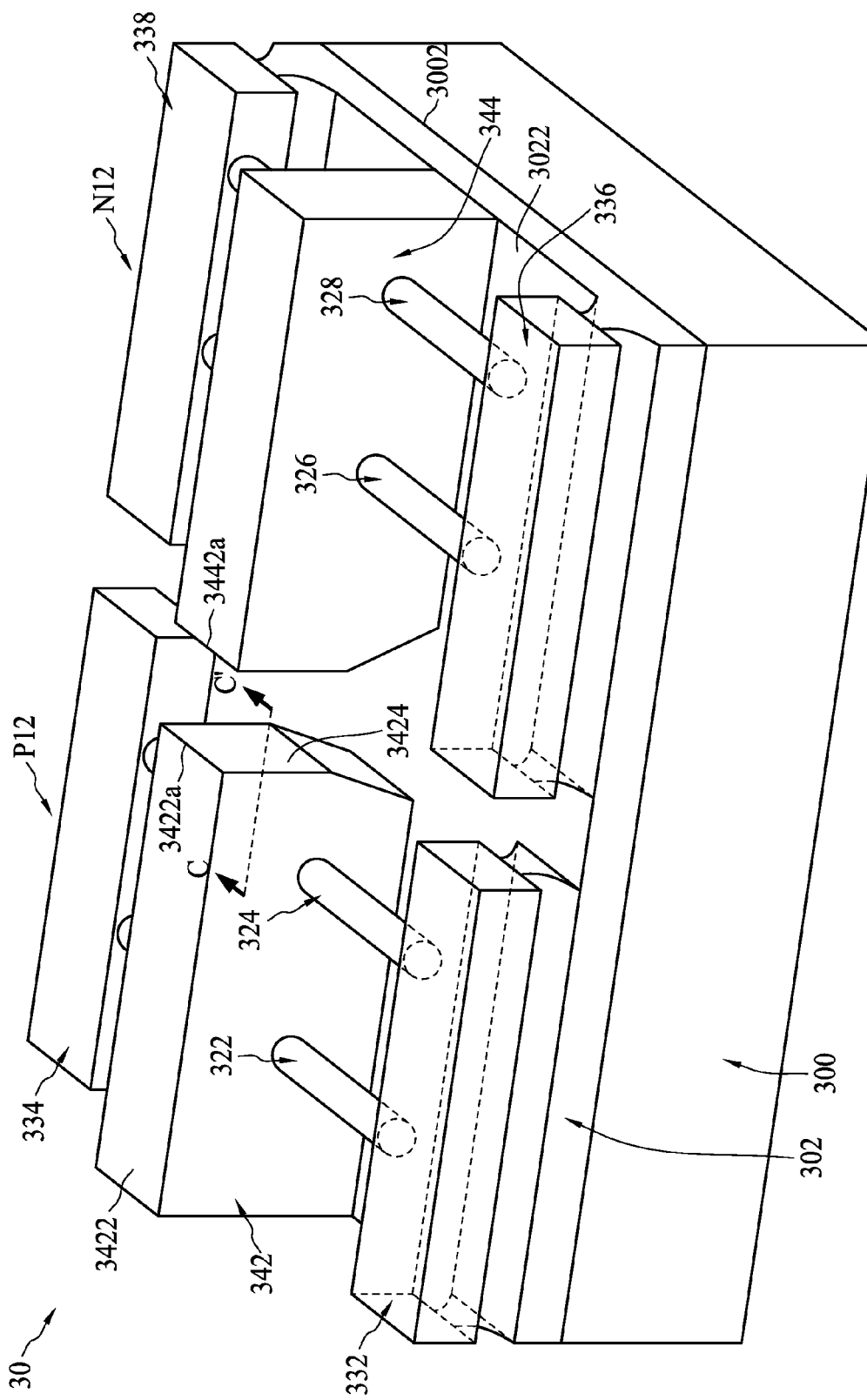
FIG. 12A is a schematic perspective diagram of a semiconductor structure with nanowire FETs having gate stacks adjacent at gate ends in accordance with some embodiments.

FIG. 12A is a schematic perspective diagram of a semiconductor structure 30 with nanowire FETs having gate stacks 342 and 344 adjacent at gate ends 3422a and 3442a in accordance with some embodiments. Compared to the p-type FET P1 and the n-type FET N1 shown in FIGS. 1A and 1B, a p-type FET P12 and an n-type FET N12 in FIG. 12A are nanowire FETs. Therefore, instead of interfacing with, for example, the fin structure 124 or 126, a gate stack 342 or 344 of the FET P12 or N12 interfaces with, for example, a nanowire 324 or 326. In some embodiments, the semiconductor structure 30 includes a silicon substrate 300, a buried oxide (BOX) layer 302, pad regions 332, 334, 336 and 338, nanowires 322, 324, 326, 328 and the gate stacks 342 and 344. In some embodiments, an SOI substrate is provided including the silicon substrate 300 configured with a surface 3002 (labeled at the level of the surface), the BOX layer 302 configured on the surface 3002 and with a surface 3022, and a silicon layer configured on the surface 3022 of the BOX layer 302. The silicon layer 302 are then patterned and etched into the pad regions 332 and 334 or 336 and 338 holding the nanowires 322 and 324, or 326 and 328 suspended over the surface 3022 of the BOX layer 302. After the nanowires 322 and 324, or 326 and 328 are formed, the gate stack 342 or 344 are then formed by, for example, a replacement gate process. In some embodiments, several films such as one or more gate dielectric layers and one or more metal layers are formed wrapping all around portions of the nanowires 322 and 324, or 326 and 328. Then, a capping layer is formed over the films wrapping all around the nanowires 322 and 324, or 326 and 328. The capping layer is patterned, etched, and over-etched into the shape of the gate stack 342 or 344 shown in FIG. 12A. The capping layer may be subsequently replaced by other suitable materials to form the gate stack 342 or 344. However, the shape of the gate stack 342 or 344 remains to have a side wall 3424 or 3442 indented towards the nanowire 324 or 326 from top to down. For simplicity, the layers in the gate stacks 324 or 344 are not shown in FIG. 12A. Further, in some embodiments, the pad regions 332, 334, 336 and 338 are removed from the semiconductor structure 30 after formation of the capping layer.

Figure 12B:
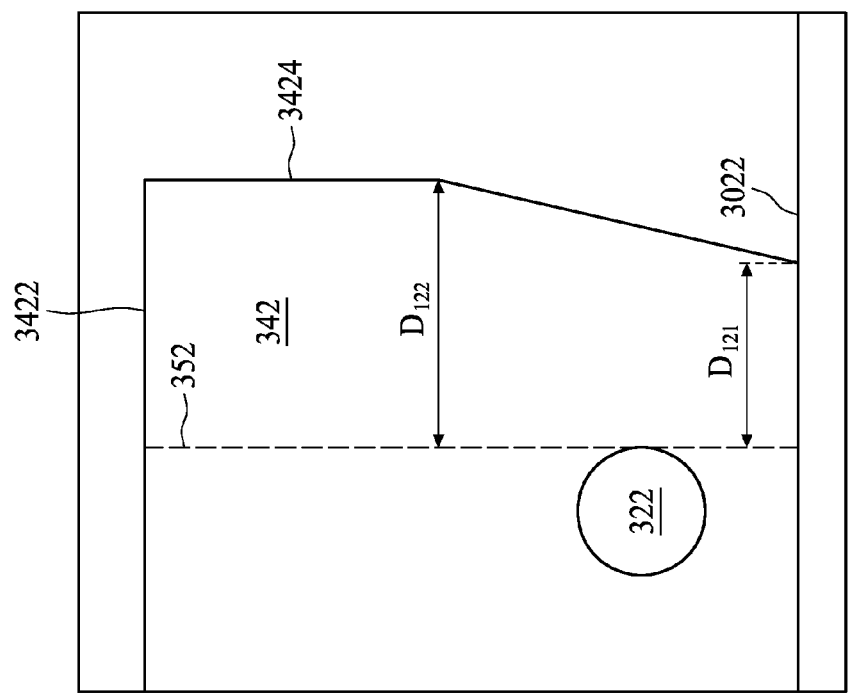
FIG. 12B is a schematic diagram of corresponding profiles of the gate stack and the nanowire of a cross section take along line C-C' in FIG. 12A in accordance with some embodiments.

FIG. 12B is a schematic diagram of corresponding profiles of the gate stack 342 and the nanowire 322 of a cross section take along line C-C' in FIG. 12A in accordance with some embodiments. Compared to the fin structure 124 having the polygonal cross-section in FIG. 1E, the nanowire 322 has a round cross-section. In some embodiments, at the level of the surface 3022, a side wall 3424 of the gate stack 342 has a distance $D_{121}$ from an imaginary vertical plane 325 intersecting the nanowire 322 at a line, and at the level of a top surface 3422 of the gate stack 342, the side wall 3222 has a distance $D_{122}$ from the imaginary vertical plane 325. The imaginary vertical plane 325 is standing vertically with respect to the surface 3022. The distances $D_{121}$ and $D_{122}$ are determined similarly as the distances $D_{11}$ and $D_{12}$ described with reference to FIG. 1E. As the imaginary vertical plane 352 is moving toward the nanowire 322 from the side wall 3424, the nanowire 322 and the imaginary vertical plane 352 first intersects at a line.

In some embodiments, a semiconductor structure includes a substrate, a dielectric region, a first non-planar structure and a first gate stack. The dielectric region is formed on the substrate. The dielectric region has a first surface at a top of the dielectric region. The first non-planar structure protrudes from the first surface. The first non-planar structure includes a first channel region, a first source region and a first drain region. The first source region and the first drain region are formed on opposite sides of the first channel region. The first gate stack is formed on the first surface and wraps around the first channel region. The first gate stack includes a first gate top surface and a first gate side wall. The first gate side wall does not intersect the first non-planar structure. The first gate side wall has a first distance from a first vertical plane at a level of the first surface. The first gate side wall has a second distance from the first vertical plane at a level of the first gate top surface. The first vertical plane is vertical with respect to the first surface. The first vertical plane intersects the first non-planar structure. The first distance is shorter than the second distance.

In some embodiments, a semiconductor structure includes a first surface, a first non-planar structure and a first capping structure. The first non-planar structure is formed on the first surface. The first capping structure is formed on the first surfaces and wraps around a portion of the first non-planar structure. The first capping structure includes a first top surface and a first side wall. The first capping structure traverses the first surface between the first side wall and a first vertical plane. The first vertical plane is vertical with respect to the first surface. The first vertical plane intersects the first non-planar structure and the first top surface. The first side wall has a first distance from the first vertical plane at a level of the first surface. The first side wall has a second distance from the first vertical plane at a level of the first top surface. The first distance is shorter than the second distance. The first capping structure has a conductive path through the first capping structure between the first side wall, and one of the first top surface and other surfaces of the first capping structure.

In some embodiments, in a method, at least one non-planar structure that protrudes from a dielectric region formed on a substrate is provided. The dielectric region includes a first surface at a top of the dielectric region. The at least one non-planar structure includes a first channel region, and a first source region and a first drain region formed on opposite sides of the first channel region. A stack of layers are formed on the at least one non-planar structure and the first surface. The at least one gate stack pattern is formed from the stack of layers. The at least one gate stack wraps around the first channel region. The at least one gate stack pattern includes a first gate top surface and a first gate side wall. The first gate side wall does not intersect the at least one non-planar structure. The first gate side wall has a first distance from a first vertical plane at a level of the first surface. The first gate side wall has a second distance from the first vertical plane at a level of the first gate top surface.

The first vertical plane is vertical with respect to the first surface. The first vertical plane intersects the first channel region, and the first distance is shorter than the second distance.

The above description includes exemplary operations, but these operations are not necessarily required to be performed in the order shown. Operations may be added, replaced, changed order, and/or eliminated as appropriate, in accordance with the spirit and scope of the disclosure. Accordingly, the scope of the disclosure should be determined with reference to the following claims, along with the full scope of equivalences to which such claims are entitled.

What is claimed is:

1. A semiconductor structure, comprising:
   a first surface located at a first level;
   a first non-planar structure protruding from the first surface,
      wherein the first non-planar structure comprises:
         a first channel region; and
         a first source region and a first drain region formed on opposite sides of the first channel region; and
   a first gate stack formed on the first surface, and wrapping around the first channel region,
      wherein the first gate stack comprises:
         a first gate top surface formed at a second level under which the first gate stack is stacked; and
         a first gate side wall that forms a corner with the first gate top surface, wherein the first gate side wall does not wrap around the first non-planar structure, the first gate side wall has a first distance from a first vertical plane at the first level, the first gate side wall has a second distance from the first vertical plane at the second level, the first vertical plane is vertical with respect to the first surface, the first vertical plane intersects the first channel region, the first source region and the first drain region, and the first distance is shorter than the second distance.

2. The semiconductor structure of claim 1, further comprising:
   a second gate stack formed on the first surface,
      wherein the second gate stack comprises:
         a second gate side wall formed at least in part adjacent to the first gate side wall, wherein the second gate side wall has a third distance from the first vertical plane at the first level, the second gate side wall has a fourth distance from the first vertical plane at the second level, and the third distance is longer than the fourth distance.

3. The semiconductor structure of claim 1, further comprising:
   a second non-planar structure protruding from the first surface,
      wherein the second non-planar structure comprises:
         a second channel region; and
         a second source region and a second drain region formed on opposite sides of the second channel region; and
   a second gate stack formed on the first surface, and wrapping around the second channel region,
      wherein the second gate stack comprises:
         a second gate top surface formed at a third level under which the second gate stack is stacked; and
         a second gate side wall that is at least in part adjacent to the first gate side wall, wherein the second gate side wall forms a corner with the second gate top surface, the second gate side wall does not wrap around the second non-planar structure, the second gate side wall has a third distance from a second vertical plane at the first level, the second gate side wall has a fourth distance from the second vertical plane at the third level, the second vertical plane is vertical with respect to the first surface, the second vertical plane intersects the second channel region, the second source region and the second drain region, and the third distance is shorter than the fourth distance.

4. The semiconductor structure of claim 1, wherein the first gate side wall has a section that tapers from a top of the section to a bottom of the section, the top of the section has the second distance with respect to the first vertical plane, and the bottom of the section has the first distance with respect to the first vertical plane.

5. The semiconductor of claim 1, wherein the first gate stack further comprises a second gate side wall, the second gate side wall wraps around the first non-planar structure and the second gate side wall stands substantially vertically with respect to the first surface.

6. The semiconductor structure of claim 1, wherein the first non-planar structure is a fin structure that protrudes through or stands on the first surface.

7. The semiconductor structure of claim 1, wherein the first non-planar structure is a suspended structure with respect to the first surface.

8. A semiconductor structure comprising:
   a first surface located at a first level;
   a first non-planar structure protruding from the first surface;
   a first capping structure formed on the first surface and wrapping around a portion of the first non-planar structure,
      wherein the first capping structure comprises:
         a first top surface formed at a second level under which the first capping structure is formed; and
         a first side wall that forms a corner with the first top surface, the first side wall does not wrap around the first non-planar structure;
      the first capping structure traverses the first surface between the first side wall and a first vertical plane, the first vertical plane is vertical with respect to the first surface, the first vertical plane intersects the portion of the first non-planar structure wrapped around by the first capping structure and portions of the first non-planar structure on opposite sides of the portion of the first non-planar structure wrapped around by the first capping structure, the first side wall has a first distance from the first vertical plane at the first level, the first side wall has a second distance from the first vertical plane at the second level, and the first distance is shorter than the second distance; and
      the first capping structure has a first conductive path through the first capping structure between the first side wall, and one of the first top surface and other surfaces of the first capping structure.

9. The semiconductor structure of claim 8, further comprising:
   a second capping structure formed on the first surface,
      wherein the second capping structure comprises:
         a second side wall and other surfaces, wherein the second side wall is formed at least in part adjacent to the first side wall, the second side wall has a third distance from the first vertical plane at the first level, the second gate side wall has a fourth distance from the first vertical plane at the second level, and the third distance is longer than the fourth distance; and the second capping structure has a second conductive path between the second side wall and one of the other surfaces of the second capping structure.

10. The semiconductor structure of claim 8, further comprising:

a second non-planar structure protruding from the first surface; and a second capping structure formed on the first surface and wrapping around a portion of the second non-planar structure, wherein the second capping structure comprises:

a second top surface formed at a third level under which the second capping structure is formed; and a second side wall that is at least in part adjacent to the first side wall, wherein the second side wall forms a corner with the second top surface, and the second side wall does not wrap around the second non-planar structure; and the second capping structure traverses the first surface between a second vertical plane and the second side wall, the second vertical plane is vertical with respect to the first surface and the second vertical plane intersects the portion of the second non-planar structure and portions of the second non-planar structure on opposite sides of the portion of the second non-planar structure wrapped around by the second capping structure, the second side wall has a third distance from the second vertical plane at the first level, the second side wall has a fourth distance from the second vertical plane at the third level, and the third distance is shorter than the fourth distance.

11. The semiconductor structure of claim 8, wherein the first side wall has a section that tapers from a top of the section to a bottom of the section, the top of the section has the second distance with respect to the first vertical plane, and the bottom of the section has the first distance with respect to the first vertical plane.

12. The semiconductor structure of claim 8, wherein the other surfaces of the first capping structure comprise a lateral surface, the lateral surface stands substantially vertically with respect to the first surface, and the lateral surface wraps around the first non-planar structure.

13. The semiconductor structure of claim 8, wherein the first non-planar structure protrudes through or stands on the first surface.

14. The semiconductor structure of claim 8, wherein the first non-planar structure is suspended with respect to the first surface.

15. The semiconductor structure of claim 8, wherein the first capping structure further comprises:

a sacrificial gate layer; and a dielectric layer formed on the sacrificial gate layer, wherein the sacrificial gate layer in the first side wall has a section that tapers from a top of the section to a bottom of the section, the top of the section has the second distance with respect to the first vertical plane, and the bottom of the section has the first distance with respect to the first vertical plane.

16. A semiconductor structure, comprising:

a first surface located at a first level;

a first non-planar structure protruding from the first surface, wherein the first non-planar structure comprises:

a first channel region; and a first source region and a first drain region formed on opposite sides of the first channel region; and a first gate stack formed on the first surface, and wrapping around the first channel region, wherein the first gate stack comprises:

a first gate side wall that wraps around the first non-planar structure, wherein the first gate side wall comprises:

a first top edge formed at a second level under which the first gate stack is stacked; and a first side edge forms a corner with the first top edge, wherein the first side edge has a first distance from a first vertical plane at the first level, the first side edge has a second distance from the first vertical plane at the second level, the first vertical plane is vertical with respect to the first surface, the first vertical plane intersects the first channel region, the first source region and the first drain region, and the first distance is shorter than the second distance.

17. The semiconductor structure of claim 16, further comprising:

a second non-planar structure protruding from the first surface, wherein the second non-planar structure comprises:

a second channel region; and a second source region and a second drain region formed on opposite sides of the second channel region; and a second gate stack formed on the first surface and wrapping around the second channel region;

wherein the first gate stack further comprises:

a second gate side wall that intersects the first gate side wall at the first side edge; and the second gate stack comprises:

a third gate side wall that wraps around the second non-planar structure, wherein the third gate side wall comprises:

a second top edge formed at a third level under which the second gate stack is stacked; and a second side edge that forms a corner with the second top edge, wherein the second side edge has a third distance from a second vertical plane at the first level, the second side edge has a fourth distance from the second vertical plane at the third level, the second vertical plane is vertical with respect to the first surface, the second vertical plane intersects the second channel region, the second source region and the second drain region, and the third distance is shorter than the fourth distance; and a fourth gate side wall that intersects the third gate side wall at the second side edge, the fourth gate side wall is at least in part adjacent to the second gate side wall.

18. The semiconductor structure of claim 16, wherein the first gate side wall stands substantially vertically with respect to the first surface.

19. The semiconductor structure of claim 16, wherein the first non-planar structure is a fin structure that protrudes through or stands on the first surface.

20. The semiconductor structure of claim 16, wherein the first non-planar structure is a suspended structure with respect to the first surface.

* * * * *